(12) United States Patent
Lavi et al.

(10) Patent No.: US 7,965,564 B2
(45) Date of Patent: Jun. 21, 2011

(54) PROCESSOR ARRAYS MADE OF STANDARD MEMORY CELLS

(75) Inventors: Yoav Lavi, Ra'anana (IL); Eli Ehrman, Beit Shemesh (IL); Avidan Akerib, Tel-Aviv (IL)

(73) Assignee: Zikbit Ltd., Caesarea (IL)

( * ) Notice: Subject to any disclaimer, the term of this patent is extended or adjusted under 35 U.S.C. 154(b) by 13 days.

(21) Appl. No.: 12/211,919

(22) Filed: Sep. 17, 2008

(65) Prior Publication Data

US 2010/0172190 A1    Jul. 8, 2010

Related U.S. Application Data

(60) Provisional application No. 60/973,190, filed on Sep. 18, 2007, provisional application No. 60/973,183, filed on Sep. 18, 2007.

(51) Int. Cl.
*G11C 7/22* (2006.01)
(52) U.S. Cl. ............. 365/189.15; 365/189.11; 365/205; 365/206; 365/207
(58) Field of Classification Search ............. 365/189.15, 365/189.11, 205, 206, 207
See application file for complete search history.

(56) References Cited

U.S. PATENT DOCUMENTS

| | | | |
|---|---|---|---|
| 4,377,855 A | 3/1983 | Lavi | |
| 5,809,322 A | 9/1998 | Akerib | |
| 5,943,502 A | 8/1999 | Sariel et al. | |
| 5,974,521 A | 10/1999 | Akerib | |
| 6,078,513 A | 6/2000 | Ong et al. | |
| 6,188,594 B1 | 2/2001 | Ong | |
| 6,195,738 B1 | 2/2001 | Akerib | |
| 6,339,540 B1 | 1/2002 | Lavi | |
| 6,405,281 B1 | 6/2002 | Akerib | |
| 6,442,060 B1* | 8/2002 | Leung et al. .......... | 365/154 |
| 6,460,127 B1 | 10/2002 | Akerib | |
| 6,467,020 B1 | 10/2002 | Stilkol et al. | |
| 6,507,362 B1 | 1/2003 | Akerib | |
| 6,549,442 B1 | 4/2003 | Lu et al. | |
| 6,711,665 B1 | 3/2004 | Akerib et al. | |
| 6,741,508 B2* | 5/2004 | Song et al. .......... | 365/196 |
| 6,757,703 B2 | 6/2004 | Shain | |
| 6,832,234 B2 | 12/2004 | Shain | |
| 7,268,788 B2 | 9/2007 | Shain et al. | |
| 7,289,354 B2* | 10/2007 | Houston .......... | 365/154 |
| 7,724,565 B2* | 5/2010 | Barth et al. .......... | 365/154 |

* cited by examiner

*Primary Examiner* — Pho M Luu
(74) *Attorney, Agent, or Firm* — AlphaPatent Associates Ltd.; Daniel J. Swirsky

(57) ABSTRACT

Standard memory circuits are used for executing a sum-of-products function between data stored in the memory and data introduced into the memory. The sum-of-products function is executed in a manner substantially similar to a standard memory read operation. The memory circuits are standard or slightly modified SRAM and DRAM cells, or computing memory arrays (CAMs).

8 Claims, 17 Drawing Sheets

PROCESSOR ARRAYS MADE OF STANDARD MEMORY CELLS

CROSS REFERENCE TO RELATED APPLICATIONS

This application claims priority from U.S. Provisional Application 60/973,190 for "Methods and Circuits for the Utilization of SRAM Cells with Pocket Implant as Arrays for Concurrent Evaluation of Quantity-Compare, Majority and Compare Functions", filed Sep. 18, 2007, and also from U.S. Provisional Application 60/973,183 for "Methods and Circuits for the Utilization of SRAM Cells as Arrays Concurrently Comparing the Number of Selected Cells Driving Bit and Complement Bit Lines to Certain Logic Levels, filed Sep. 18, 2007, which applications are incorporated herein by reference

FIELD OF THE INVENTION

The present invention relates, in general, to the field of computing memory arrays, such as PAL (Programmable Array Logic), and Content Addressable Memory (CAM). In particular the present invention relates to methods and circuits for the application of standard Random Access Memories (RAM) as the basic building blocks for arrays which evaluate the sum of products of an input vector and a multitude of stored vectors, which can be used as a basis for the implementation of such arrays. In addition, the present invention relates to methods and circuits for the application of arrays comprising standard or slightly modified Random Access Memory (RAM) arrays, which evaluate the sum of products of an input vector and a multitude of stored vectors, as building blocks for the construction of such computing memory arrays.

BACKGROUND OF THE INVENTION

Historically, basic cells of such computing memory arrays were custom designed, to allow for high performance. However, such approach does not take advantage of the huge technological progress achieved in the area of standard RAM in recent years.

The present invention relates to sum-of-products function of an input vector and a multitude of stored vectors (also known as a compare function) and also relates to arrays which implement quantity compare and majority logic. In particular the present invention relates to methods and circuits for the application of standard Static Random Access Memories (SRAM) as the basic building blocks for arrays which determine if unmasked bits of an input vector are identical to a multitude of stored vectors, where such arrays can also be utilized to the evaluation of magnitude/quantity compare and majority logic functions between bits of stored vectors.

Provisional Applications U.S. 60/948,743: "Methods and Circuits for the Utilization of Standard and Slightly Modified RAM cells as Sum-of-Products Evaluation Arrays", U.S. 60/948,744: "Novel Computing Memory Architecture", and U.S. 60/973,183: "Methods and Circuits for the Utilization of Standard and Slightly Modified SRAM Cells as Arrays for Concurrent Evaluation of Quanti-ty-Compare, Majority and Compare Functions", are incorporated herein in entirety as reference to the present invention.

PRIOR ART

According to the prior art, cells of computing memory arrays in general and those of CAM in particular, comprise of storage elements and comparison elements. Such cells are sometimes ternary, with the capability to store three logic states (0, 1, don't care) and to compare the stored data with three possible input values (0, 1, don't care). In other cases the storage is binary and the input value ternary, and in yet other cases both the storage and the input are binary.

FIG. 1 depicts two circuits (b and c) which are commonly used in prior art CAM cells. In both (b) and (c), there is a storage element at the center. The storage is binary in the case of circuit (b), and ternary in the case of circuit (c). The storage cell may comprise standard SRAM cells such as the one depicted in (a), where one such cell is needed for binary CAM cell (b), and two such cells in the case of ternary CAM cell (c).

A comparison is done in binary CAM (b) as follows. The common match line ml, which is common to a multitude of horizontally-arranged binary CAM cells, is precharged to logic high; at the same time bit lines sl and ~sl are held at logic low.

At the next phase, sl and ~sl will be driven by the value of the vector bit to be compared and the inverse of such vector bit, respectively. If the vector bit to be compared is not equal to the stored bit, one of the two, two-transistor paths to the left and to the right of the storage cells will have both transistors on, conduct, and discharge ml, indicating no-match. The circuit is designed such that if a single two-transistor path in the multitude of cells sharing the same ml line conducts, ml will discharge fast enough to allow timely detection of mismatch.

Circuit (b) allows masking of individual bits off the comparison—this is done by keeping both sl and ~sl low, in which case none of the two, two-transistor paths would conduct; thus circuit (b) has a ternary input vector.

However, circuit (b) is not ternary in the sense that the stored bit cannot assume the value of don't care. This is possible with cell (c). Here the stored bit may be 0 (d0=0, d1=1), 1 (d0=1, d1=0) or masked-off (d0=0, d1=0). When the bit is masked off, none of the two two-transistor paths would conduct. The storage cell of circuit (c) typically comprises two SRAM cells, such as the one depicted in (a).

It should be noted that CAM operation is a special case of sum-of-products evaluation, where each such product comprises an input variable sl, and a stored variable d. CAM operation is the subset of sum-of-products operation, where in any set of products, for every value of i, if in the product $sl_i * d_i$ exists, the product $\sim sl_i * \sim d_i$ exists as well; and if the product $\sim sl_i * d_i$ exists, the product $sl_i * \sim d_i$ exists.

Cells are arranged in arrays. Each such array has common vertical lines, used to drive the sl, ~sl compare lines, and the bl, ~bl RAM read-write lines. The array also has horizontal control lines, comprising the RAM Read/Write control line (wl in circuit (a)), and the common match-line (ml in circuits (b), (c)). Accordingly, there are typically driver and sense circuits at vertical and horizontal edges of the array, comprising one or more of the following:

bl and ~bl write-data driver lines, which may include precharge, on the vertical edge of the array;

differential sense amplifier on the bl and ~bl lines, to sense the stored level of the cell, on the vertical edge of the array;

sl and ~sl compare data driver lines, which may include precharge, on the vertical edge of the array;

read/write driver line, to drive the r/w line, on the horizontal edge of the array;

match-line sense amplifier, including precharge, to sense if the ml line is discharged or remains in high, on the horizontal edge of the array.

In addition, full CAM arrays often include, inter alia, logic circuits such as priority encoding of rows in CAM arrays.

In the example above, the CAM cells (b) and (c) are large, comprising 10 and 16 transistors, respectively. In addition, they require special design, and therefore cannot rely on highly optimized SRAM and DRAM cells, which are designed and perfected whenever new semiconductor technologies are made available in the chip industry.

Thus, there is a need for a computing memory array technology which capitalizes on SRAM advances to achieve dense computing memory arrays.

In addition, in applications where long term storage is not important, there is a need for a computing memory technology which relies on optimized DRAM structures, to achieve even smaller computing memory cell size, compromising storage retention time.

SUMMARY OF THE INVENTION

Aspects of the present invention relate to memory arrays of standard memory cells and methods of executing various parallel operations on data in the arrays. In distinction to prior art arrays, the arrays of the present invention use standard, or almost standard, memory cells.

There is thus provided, in accordance with the teachings of the present invention the following circuits and memory arrays:

1. Circuits to concurrently evaluate sum-of-products functions of a given input vector and a multitude of stored vectors, comprising of standard SRAM cells or slightly modified standard SRAM cells, where stored vectors are stored in the SRAM cells, inputs vectors are introduced on the Read-Write lines of at least part of the SRAM array, sum-of-products is evaluated by sensing the voltage level on the bit lines of the SRAM array; and where such circuits also retain standard SRAM functionality.
2. The circuit of (1), where said bit lines are sensed by modified SRAM sense amplifiers, comprising voltage limiting sub-circuits, which force the voltage on said bit lines to a level not lower than a certain threshold voltage, which is higher than the threshold voltage of the pull-down devices of the SRAM cells
3. The circuit of (1), where sum of product operations are done in parallel for the stored vectors and the inverse of the stored vectors, sum-of-products operation of an input vector and the stored vectors is done by sensing the voltage level on the bit lines, and the sum-of-products operation of an input vector and the inverse of the stored vectors is done by sensing the voltage level on the inverted bit lines.
4. Circuits to concurrently evaluate two sets of sum-of-products functions of two given input vectors and a multitude of stored vectors, comprising of Standard SRAM cells modified so as to have two separate Select controls for the two Select transistors, and with the SRAM cells being otherwise of standard or slightly modified standard design, where stored vectors are stored in the SRAM cells, a first group of input vectors is introduced on the Read-Write lines of a first group of select transistors of at least part of the SRAM array, a second group of input vectors is introduced on the Read-Write lines of a second group of select transistors of at least part of the SRAM array, where sum-of-products is evaluated by sensing the voltage level on the bit lines of the SRAM array; and where such circuits also retain standard SRAM functionality.
5. The circuits of (4), where said bit lines are sensed by sense amplifiers comprising voltage limiting sub-circuit, which forces the voltage on said bit lines to a level not lower than a certain threshold voltage, which is higher than the threshold voltage of the pull-down devices of the SRAM cells.
6. Circuits as in (4) where said first group of input vectors is introduced on the Read-Write lines of a first group of Select Transistors for limited time duration, such time duration designed to limit the voltage drop on said bit lines so that the retained voltage will be higher than a certain threshold voltage.
7. Circuits to concurrently evaluate sum-of-products function of a given input vector and a multitude of stored vectors, comprising of Standard DRAM cells or slightly modified DRAM cells, where stored vectors are stored in the DRAM cells, inputs vectors are introduced on the Read-Write lines of at least part of the DRAM array, and sum-of-products is evaluated by sensing the voltage level on the bit lines of the DRAM array; and where such circuits also retain standard DRAM functionality.
8. The circuits of (6) where the sum-of-products operation is destructive, and sometimes results in the loss of some of the bits of the stored vector.
9. The circuits of (6), where separate products are read sequentially, in parallel for a multitude of stored vectors, and with logic external to the array determining the logic level of the sum of products.
10. Circuits comprising a multitude of SRAM cells, arranged in rows and columns, where each cell connects to a word line, a bit line and a complemented bit line; where said bit lines and complemented bit lines are arranged in columns; said word lines are arranged in rows; each row comprises a word line operable to connect said cell to said bit lines and said complemented bit lines; a driving circuit is operable to activate one and more than one word lines, such activation being operable for writing data into said cells, reading data from said cells and comparing data in said cells; said cells are designed to store logic values, which can be written into, for each individual cell, when the word line connected to said cell is activated, the logic value to be stored in said cell is applied to the bit line connected to said cell, and the complement of the logic value to be stored in said cell is applied to the complemented bit line connected to said cell; said cells are designed to drive the bit line and complemented bit line with the stored value and the complement of the store value when said word line is activated and said bit line and complemented bit lines are not driven; a sense amplifier is connected to each column detects if the current on the bit line is larger than the current on the complemented bit line;
11. Circuits as in 10 configured to compare the number of bits having a first set of logic states in a first group of bits, to the number of bits having a second set of logic states in a second group of bits, where said two sets of logic states could be different, fully identical or partly identical, said two groups of bits could comprise some, all or no common bits; where such comparison is done concurrently to a multitude of stored groups of bits arranged in columns, said logic states and said groups of bits are determined by a common inputs vector, and the sense amplifier in each column compares the current in the bit line to the current in the complemented bit line.
12. The circuit of (11), where said SRAM cells are also operative as an ordinary RAM array
13. Circuits as in 12 to concurrently compare the number of bits matching an input pattern in two subsets of a vector, concurrently for a multitude of stored vectors, where a matched bit is a bit which has the same logic value as a corresponding pattern bit in an input vector, where stored vectors are stored in the SRAM cells, inputs vectors are introduced on the Read-Write lines of at least part of the SRAM array, the logic state of the bit lines is determined according to the input vector pattern, and the comparison is done by differential sense amplifiers, which detect, directly or indirectly, the difference in currents between the bit lines and the complemented-bit lines in a multitude of columns.

14. Circuits as in 11 to concurrently check if the majority of bits in a subset of a vector, are at a logic state corresponding to the logic state of a corresponding bit in an input vector, concurrently for a multitude of stored vectors, where stored vectors are stored in the SRAM cells, inputs vectors are introduced on the Read-Write lines of at least part of the SRAM array, the logic state of the bit lines is determined according to the input vector, and the majority is evaluated by differential sense amplifiers, which detect the difference in currents between the bit lines and the complemented-bit lines in a multitude of columns.

15. Circuits as in 11 to concurrently compare a multitude of stored vectors with a single input vector, where stored vectors are stored in the SRAM cells, inputs vectors are introduced on the Read-Write lines of at least part of the SRAM array, at least one cell with a known logic state is added in each column, the logic state of the bit lines is determined according to the input vector, and comparison is evaluated by a differential sense amplifiers, which detect the difference in currents between the bit lines and the complemented-bit lines in a multitude of columns.

16. Circuits comprising a multitude of modified SRAM cells, arranged in rows and columns, where each cell connects to a left-word-line, a right-word-line, a bit line and a complemented bit line; where said bit lines and complemented bit lines are arranged in columns; pairs of said left-word-lines and right-word-line are arranged in rows; each row comprises a left-word-line operable to connect said cell to said bit lines, and a right-word-line operable to connect said cell to said complemented bit lines, where said bit line is driven by the stored value, and said complemented bit line is driven by the value of the complement of the stored value; a driving circuit is operable to activate one and more than one word lines, such activation being operable for writing data into said cells, reading data from said cells and comparing data in said cells; said cells are designed to store logic values, which can be written into, for each individual cell, when the left-word-line and/or the right-word-line connected to said cell are activated, the logic value to be stored in said cell is applied to the bit line connected to said cell, and the complement of the logic value to be stored in said cell is applied to the complemented bit line connected to said cell; said cells are designed to drive the bit line with the stored value when said left-word-line is activated and said bit line is not driven, and the complemented bit line with the complement of the stored value when said right-word-line is activated and said complemented bit line is not driven; a sense amplifier is connected to each column detects if the current on the bit line is larger than the current on the complemented bit line;

17. Circuits as in 16 configured to compare the number of bits having a first set of logic states in a first group of bits, to the number of bits having a second set of logic states in a second group of bits, where said two sets of logic states could be different, fully identical or partly identical, said two groups of bits could comprise some, all or no common bits; where such comparison is done concurrently to a multitude of stored groups of bits arranged in columns, said logic states and said groups of bits are determined by a common inputs vector, and the sense amplifier in each column compares the current in the bit line to the current in the complemented bit line.

18. The circuit of (17), where said modified SRAM cells are also operative as an ordinary RAM array.

19. Circuits as in 18 to concurrently compare the number of bits matching an input pattern in two subsets of a vector, concurrently for a multitude of stored vectors, where a matched bit is a bit which has the same logic value as a corresponding pattern bit in an input vector, where stored vectors are stored in the modified SRAM cells, inputs vectors are introduced on the Read-Write lines of at least part of the SRAM array, the logic state of the bit lines is determined according to the input vector pattern, and the comparison is done by differential sense amplifiers, which detect, directly or indirectly, the difference in currents between the bit lines and the complemented-bit lines in a multitude of columns.

20. Circuits as in 19 to concurrently check if the majority of bits in a subset of a vector, are at a logic state corresponding to the logic state of a corresponding bit in an input vector, concurrently for a multitude of stored vectors, where stored vectors are stored in the modified SRAM cells, inputs vectors are introduced on the Read-Write lines of at least part of the modified SRAM array, the logic state of the bit lines is determined according to the input vector, and the majority is evaluated by differential sense amplifiers, which detect the difference in currents between the bit lines and the complemented-bit lines in a multitude of columns.

21. Circuits as in 19 to concurrently compare a multitude of stored vectors with a single input vector, where stored vectors are stored in the modified SRAM cells, inputs vectors are introduced on the Read-Write lines of at least part of the modified SRAM array, at least one cell with a known logic state is added in each column, the logic state of the bit lines is determined according to the input vector, and comparison is evaluated by a differential sense amplifiers, which detect the difference in currents between the bit lines and the complemented-bit lines in a multitude of columns.

22. Circuits to concurrently evaluate sum-of-products functions of a given input vector and a multitude of stored vectors, comprising of standard SRAM cells or slightly modified standard SRAM cells, where stored vectors are stored in the SRAM cells, inputs vectors are introduced on the Read-Write lines of at least part of the SRAM array, sum-of-products is evaluated by sensing the voltage level on the bit lines of the SRAM array; and where such circuits also retain standard SRAM functionality, where said SRAM or Modified SRAM cells are also pocket implanted at the transfer devices, where the word line voltage applied when Write is not needed is less than the threshold needed for current flow from the cell to the bit-line, but higher than that needed for current flow from the bit line to the cell.

23. The circuit of (22), where said bit lines are sensed by modified SRAM sense amplifiers, which sense if said bit line is discharged.

24. The circuit of (22), where sum of product operations are done in parallel for the stored vectors and the inverse of the stored vectors, sum-of-products operation of an input vector and the stored vectors is done by sensing the voltage level on the bit lines, and the sum-of-products operation of an input vector and the inverse of the stored vectors is done by sensing the voltage level on the inverted bit lines.

25. Circuits to concurrently evaluate two sets of sum-of-products functions of two given input vectors and a multitude of stored vectors, comprising of standard SRAM cells modified so as to have two separate select controls for the two select transistors, and with the SRAM cells being otherwise of standard or slightly modified standard design, where said SRAM or Modified SRAM cells are also pocket-implanted at the transfer devices, where the word line voltage applied when Write is not needed is less than the threshold needed for current flow from the cell to the bit-line, but higher than that needed for current flow from the bit line to the cell, where stored vectors are stored in the SRAM cells, a first group of input vectors is introduced on the word lines of a first group of select transistors of at least part of the SRAM array, a second group of input vectors is introduced on the word lines of a second group of select transistors of at least part of the SRAM array, where sum-of-products is evaluated by sensing the voltage level on the bit lines of the SRAM array; and where such circuits also retain standard SRAM functionality.

26. The circuits of (25), where said bit lines are sensed by sense amplifiers, which sense if any of the two said bit lines is discharged.

27. Circuits to concurrently check if the majority of bits in a subset of a vector are at a logic state corresponding to the logic state of a corresponding bit in an input vector, currently for a multitude of stored vectors, where stored vectors are stored in the SRAM cells, inputs vectors are introduced on the word lines of at least part of the SRAM array, the logic state of the bit lines is determined according to the input vector, and the majority is evaluated by differential sense amplifiers, which detect the difference in currents between the bit lines and the complemented-bit lines in a multitude of columns.

28. The circuit of (27), where said SRAM cells are also operable as an ordinary RAM array 29. Circuits to concurrently compare a multitude of stored vectors with a single input vector, where stored vectors are stored in the SRAM cells, inputs vectors are introduced on the word lines of at least part of the SRAM array, at least one cell with a known logic state is added in each column, the logic state of the bit lines is determined according to the input vector, and comparison is evaluated by a differential sense amplifiers, which detect the difference in currents between the bit lines and the complemented-bit lines in a multitude of columns.

30. The circuit of (29) where said SRAM cells are also operative as an ordinary RAM array.

31. Circuits which emulate the functionality of random access memories in all or most aspects, and, in addition, concurrently compare the logic values stored in a matrix comprising columns and rows of storage cells with an input vector.

32. Circuits as in 31, where the storage array comprises Standard SRAM cells or slightly modified SRAM cells, having a Select Line, a Bit Line and an Inverted-Bit Line.

33. Circuits as in 32, where a Match output line is asserted for every stored column, where all unmasked input vector bits have the same logic value as the corresponding bits in said column of said matrix, where Read and Write are done in the same way as they are in standard SRAM array, and where Compare is done using the same Bit Lines and Select Lines which are otherwise used for data read and data write.

34. Circuits as in (33), where each bit stored in said matrix occupies two standard SRAM cells, with one cell storing the value of the stored bit and the other cell storing the inverse of the value of the stored bit, and with both cells storing the same logic level when the stored bit is masked off; where comparison is done by the concurrent application of:
   A high voltage level on the Select Lines of those storage cells storing the value of the matrix bits, if the corresponding input vector bit is at logic one,
   A high voltage level on the Select Lines of those storage cells storing the inverse of the value of the matrix bits if the corresponding input vector bit is at logic zero,
   Low voltage level on the Select Lines of both cells storing the value and the inverse of the value of the matrix bits, if the corresponding input vector bit is masked off;
And where a sense amplifier circuit is connected to at least one of said two bit lines of each column of said matrix, such sense amplifier indicating a match between said input vector and said matrix column if said bit line is not pulled low by any of cells connected thereto.

35. Circuits as in (33), where each bit stored in said matrix occupies a single SRAM cell, and where a compare cycle comprises two cycles where:
   In one compare cycle those Select Lines corresponding to set bits of said input vector are driven high, and a sense amplifier connected to one of the two bit lines of said matrix column senses whether said bit line is pulled low; and where,
   in a second cycle, those Select Lines corresponding to cleared bits of said input vector are driven high, and a sense amplifier connected to a second bit line of said matrix column senses whether said second bit line is pulled low; and where
   a Match is determined if both sense amplifiers detect that neither of the two bit lines is driven low.

36. Circuits as in (33), comprising modified SRAM cells having a First Select Line for the first Select Transistor and a Second Select Line for the second Select transistor, where each bit stored in said matrix occupies a single SRAM cell, and where comparison is done by the concurrent application of:
   A high voltage level on said First Select Line of all cells for which the corresponding input vector bit is at logic one,
   A high voltage level on said Second Select Line of all cells for which the corresponding input vector bit is at logic zero,
   A low voltage level on both First and Second Select Lines of all cells for which the corresponding input vector bit is masked off;
And where two sense amplifier circuits are connected to the two bit lines of each column of said matrix, such sense amplifiers indicating a match between said input vector and said matrix column if neither of said bit lines is pulled low by any of the storage cells connected thereto.

37. Circuits as in 31, where the storage array comprises Standard DRAM cells, having a Select Line, and a Bit Line.

38. Circuits as in 37, generating match for every stored column where all unmasked input vector bits have the same logic value as the corresponding bits on said column in said matrix, where such array comprises Standard DRAM cells, having a Select Line and a Bit Line, where Read and Write are done in the same way as they are done in standard DRAM array, where Compare is done using the same Bit Lines and Select Lines which are otherwise used for data read and data write, where each bit stored in said matrix occupies two standard DRAM cells, with one cell storing the value of the stored bit and the other cell storing the inverse of the value of the stored bit, and with both cells storing the same logic level when the stored bit is masked off; and where comparison is done by the concurrent application of:

A high voltage level on the Select Lines of those storage cells storing the value of the matrix bits, if the corresponding input vector bit is at logic one, A high voltage level on the Select Lines of those storage cells storing the inverse of the value of the matrix bits, if the corresponding input vector bit is at logic zero, Low voltage levels on the Select Lines of both storage cells for which the corresponding input vector bit is masked off;

and where a sense amplifier circuit is connected to the bit line of each column of said matrix, such sense amplifier indicating a match between said input vector and said matrix column if said bit line is not pulled low by any of the cells connected thereto.

39. A circuit as in (38) where single-bit compare operations are defined, with a single bit being compared and all other bits masked off; and where a multi-bit compare of a multitude of unmasked input vector bits comprises sequential single bit compare operations for each unmasked bit, where a circuit annexed to said sense amplifier detects if all single-bit compare operations for all unmasked bits of a said multi-bit compare match.

40. A circuit such as in (33) or in (37), where at least some of the stored bits and the corresponding input vector bits are translated to a code where a fixed number of bits is at logic high.

DETAILED DESCRIPTION OF THE INVENTION

Figure 1A:
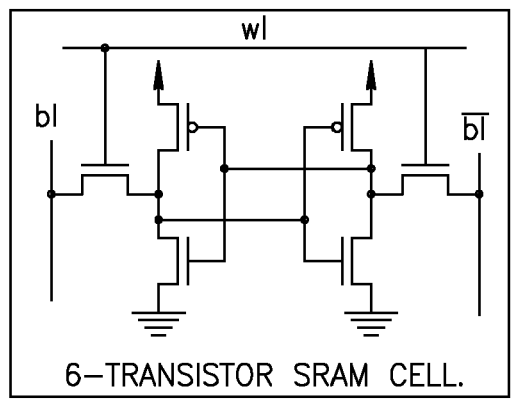
FIG. 1 illustrates prior art memory cells.
Figure 1B:
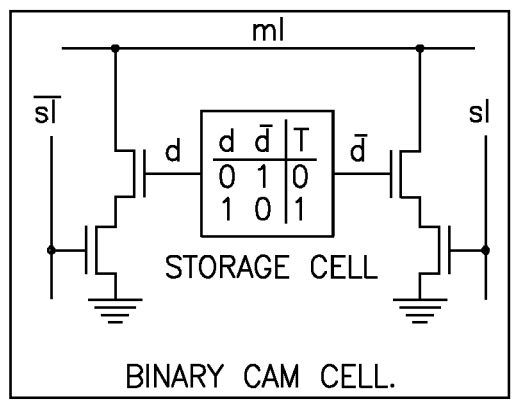
Figure 1C:
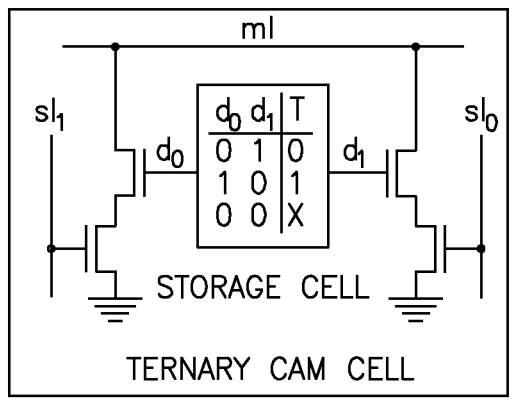

According to the present invention, commonly used RAM cells of two varieties are used to store a multitude of vectors. Such vectors will be referred to as A and B, where A is a one-dimensional bit vector using index i as a bit index, and Vector B is a two-dimensional bit vector using indices i,j, where j indicates a multi-bit value in Vector B and i,j indicates bit i within value Bj. The present invention describes how a plurality of values Bi, i.e., bit i within a plurality of values j, can be compared concurrently to a single bit value Ai. Furthermore, the present invention teaches how a plurality of values in vector B can be evaluated concurrently to a single value A.

The RAM cells are read and written as they would be in ordinary RAM; however, the sense amplifier is modified to allow sum-of-products evaluation by introducing non-zero elements of Vector A on the read input of the RAM cells. In some embodiments, the non-zero elements of Vector A are introduced sequentially. In other words, at each stage a non-zero bit Ai is introduced on a read cycle to bit Bi in a plurality of words Bj. The sum-of-products evaluation is done by applying a read cycle, where several rows are accessed concurrently. In other embodiments, a plurality of non-zero bits in Vector A are introduced to respective pluralities of bits in several rows of Vector B concurrently. This evaluates the plurality of bits in each of rows j concurrently. To reiterate, a plurality of bits i are evaluated in a plurality of rows j in parallel.

The method above describes how to evaluate non-zero bits in A with corresponding bits in B. In order to evaluate zero bits in A, the sum of products of all unmasked ~Bi,j and the corresponding ~Ai term is evaluated.

The disclosure describes in detail how standard or slightly modified RAM cells can be used to evaluate such sum of products. It also describes how CAM and other computing memory arrays are implemented using such cells, and evaluating the sum of products according to the present invention.

It should be noted that, using positive logic terminology, the circuits to be described below implement the inverse of the sum-of-products operation, assuming a low voltage level when sum-of-products is evaluated to logic true. For positive logic output, the output of the described circuits should be inverted. Such an inversion is not shown in the discussion below, for simplicity. In the description and discussions below, therefore, sum-of-products will refer to negative logic output for sum-of-products operation.

It should also be noted that while Vector B is two dimensional, the description below generally concentrates on one column of B; other columns are subject to the same operations, and are omitted in some cases, for the sake of description clarity.

According to the present invention, commonly used RAM cells of two varieties are arranged in arrays so as to compute the sum of products of an input vector and a multitude of stored vectors. The input vector is referred to as Ai, and the multitude of stored vectors are referred to as Bi,j. The present invention describes the structure of the cells, how they can be used to evaluate the sum of products, and how such arrays are built to compare vectors, and to form CAM arrays.

In some embodiments of the present invention based on standard SRAM cells, bits of stored vector Bi,j occupy two cells, with one cell storing the value Bi,j and the other cell storing the value ~Bi,j. A compare operation is done by computing a sum of products comprising products of all unmasked Bi,j the corresponding Ai terms, as well as products of all unmasked ~Bi,j and the corresponding ~Ai terms. Thus, a complete Compare operation is accomplished.

In other embodiments, or in alternative configurations of preferred embodiments, one bit is used for each Bi,j. A compare operation is done in two clock cycles, where in one clock cycle the sum of products of all unmasked Bi,j and the corresponding Ai term is evaluated on one of the two vertical lines, and in the other clock cycle the sum of products of all unmasked ~Bi,j and the corresponding ~Ai term is evaluated on the other vertical line. A match is determined if in both cycles the sum of products is evaluated to logic 1.

In yet other embodiments, a modified SRAM cell is used. In these embodiments, Vector Ai is driven on one group of horizontal lines, while vector ~Ai is driven on the other group. Evaluation of the sum of products of all unmasked Bi,j and the corresponding Ai terms is done on one vertical line, and the sum of products of all unmasked ~Bi,j and the corresponding ~Ai terms is done on the other vertical line, at the same time. A match is detected if the two vertical lines evaluate to logic 1.

Lastly, in some embodiments, a DRAM cell is used. In those embodiments, two cells are used to store a single bit Bi,j, where one cell stores the value of Bi,j and the other one stores the value of ~Bi,j. Compare is done by evaluating the sum of products of all unmasked Bi,j and the corresponding Ai terms, and concurrently evaluating the sum of products of all unmasked ~Bi,j and the corresponding ~Ai terms. In some cases, such compare operations may be destructive; in some embodiments compare is done one bit at a time, and hence it is non-destructive, but may take several clock cycles.

According to the present invention, commonly used SRAM cells of two varieties store a multitude of vectors. Such vectors will be referred to as Bi,j.

For the sake of making this disclosure shorter, we will use the symbol~ for negated or complemented value.

The SRAM cells are read and written as they would be in ordinary SRAM; however, rather than having a single word line active, as is the case with ordinary RAM, more than one word line can be active at a time.

Consequently, several cells may drive each of the two bit lines in each column of SRAM cells. According to certain embodiments of the invention the sense amplifier is modified and a unipolar mode is added. According to other embodiments, the sense-amplifier remains unchanged or almost unchanged in the standard differential format, detecting which of the two bit lines has a higher current drive, or alternatively, faster discharge curve, at a speed comparable to that of a standard SRAM. In both uses, the bit lines may be equipped with voltage dampers, which limit the discharge voltage so as to assure that no cell with stored high will be flipped. Several examples of functions which can be implemented using an array of SRAM or modified SRAM cells according to the present invention are disclosed. These three examples illustrate various functions that can be implemented using the differential sense amplifier embodiment as opposed to the unipolar sense amplifier embodiment.

As a first example, a compare operation with a common input vector can be implemented by allocating several cells with known logic states; for example, to compare (a,b,c) to (1,0,1), the word lines of a, ~b and c are activated, along with two word lines which connect to cells with stored logic-0. As a result, a column with stored 1,0,1 will have three driving cells on the bit lines, and two driving cells (those with stored 0) on the ~bit line, and, hence, its sense amplifier will detect 1. All other columns will have more drivers on the ~bit lines than on the bit line. A column with stored (1,1,1), for example, will have two drivers on the bit-line (a and c), and three on the ~bit line (~b and the two 0 cells).

As a second example, majority function of bits in a subset can be evaluated, with an indication for each stored vector whether the majority of bits are at logic 1 or logic 0.

As a third example, a comparison function of two sets is implemented, where each set comprises stored bits and complements of stored bits, and the function determines, for each stored vector, which of the two sets has a higher number of true values.

According to the further features in preferred embodiments of the invention, a pocket implant is added to the transfer devices of the SRAM cells. In addition, two voltage levels are applied to the gates of the transfer devices—a lower voltage in compare and read operations, and a higher voltage in write operations.

The doping level of the pocket implant is such that when the lower voltage level is applied to the gates of the transfer transistors, they can only conduct current from the bit line to the cell, and hence there is no risk that cells with stored high will flip. However, the doping is such that with the higher voltage level applied during write operations, the transistors can conduct in both directions, so that 0 can be written into the cells.

Configuration 1: Unipolar Sense Amplifier in Standard SRAM Array

Figure 2:
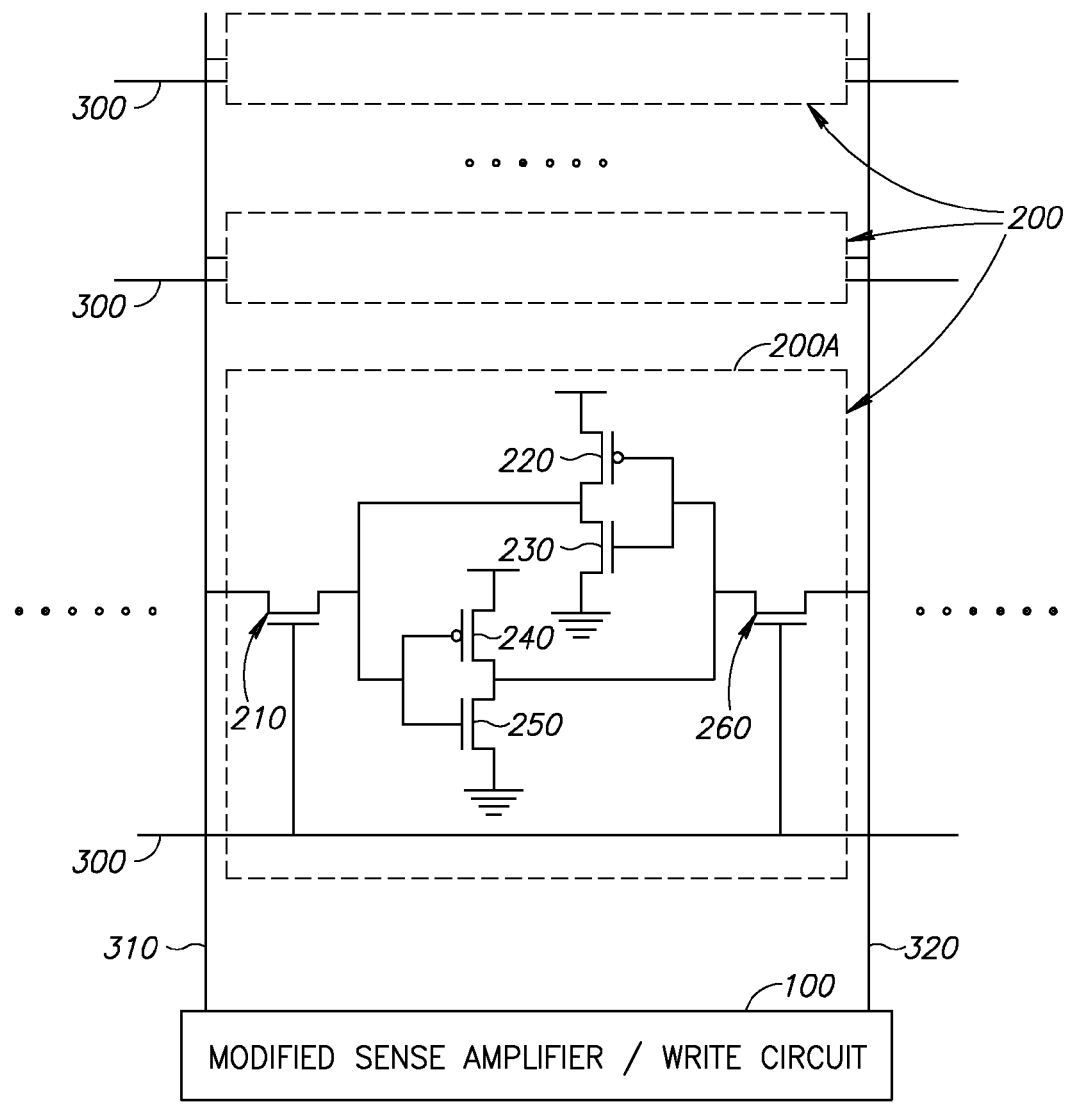
FIG. 2 is a circuit diagram of a standard SRAM cell according to the teachings of the present invention.

Referring to the figures, FIG. 2 depicts the structure of an SRAM based array according to certain embodiments of the present invention. The array is very similar to a standard SRAM array, and in some embodiments uses the exact same devices and layout. Cells 200, along with modified sense amplifier and write circuit 100, comprise a row of the array, which repeat a multitude of times. With reference to the notation used above, the series of cells 200 shown in FIG. 2 store one row value Bj. Each of cells 200 shown in FIG. 2 stores a bit Bi,j within the value Bj. For example, the three cells 200 shown store bits 0, 1 and 2 within word Bj. Notice that each row Bj has a separate sense amplifier.

Each such row comprises a multitude of cells 200. One such cell—200A, is illustrated to detail. It comprises two cross coupled inverters and two read/write transistors.

The two cross coupled inverters comprise pull-down devices 230, 250, and pull-up devices 220, 240. The read/write transistors are designated 210 and 260. The other cells designated 200 may be identical to the detailed cell 200A.

Those knowledgeable in the art will recognize that FIG. 2 describes a standard SRAM array, which can be implemented using standard and highly optimized SRAM cells. The SRAM is read by applying logic high on one of horizontal lines 300, and then sensing the difference in the voltage on lines 310, 320, which may be precharged prior to the read operation.

The SRAM cell may be written and set to a state where there is logic high on the left side and logic low on the right side, by applying high on one of the horizontal lines 300, high on vertical line 310 and low on vertical line 320. The same process, mutatis mutandis, is used to set the cell to the opposite state.

We will refer to a cell as storing logic 1 if the voltage level on the gates of devices 220, 230 is high, while the voltage level on the gates of devices 240, 250 is low. Conversely, a cell will be considered as storing logic 0 if the voltage level on the gates of devices 220, 230 is low and the voltage level on the gates of devices 240, 250 is high.

The circuit design of standard SRAM cells is such that pull-down devices 230, 250 are strong, while pull-up devices 220, 240 are weak, and used mainly as sustaining devices. In some SRAM designs pull-up devices 220, 240 are replaced by passive resistors with very high resistance, in the giga-ohm range. The fact that the pull-up devices are very weak is a major enabler to the present invention.

According to the present invention, the circuit depicted in FIG. 2 can be used to evaluate sum-of-products between Vector A, which is asserted on lines 300, and Vector B, stored in cells 200.

When sum-of-products is evaluated, lines 300 of rows for which Ai=1 are asserted high. The sense amplifier is set to a non-standard mode of operation, where discharge of lines 310, 320, which may be precharged, is detected, rather than the voltage difference between the lines. In addition, voltage on the lines is clamped so it cannot assume a level lower than a certain level $V_{stop}$, which, in some embodiments, is set to a level close to Vth of transistors 250, 230.

For every cell with lines 300 at high, if its right side is at high, and hence its left side is at low, it will pull line 310 low, through transistor 210. Line 310 will be pulled low if at least in one of cells 200, line 300 will be at logic high and the left side of the storage will be at logic low. This way, a negative-logic sum-of-products is evaluated, for the Ai*Bi products in a single row Bj. The process an execute concurrently on a plurality of rows Bj.

At the same time, sum of products of Vector A and the inverse of Vector B is evaluated, through transistors 260. If for any line 300 is at logic high, there is at least one cell with its right side at logic low, line 320 will be pulled low through transistor 260. Thus, the circuit depicted in FIG. 2 implements two sum of product calculations at the same time:

$$V_{310}=\text{Sigma}(Ai*Bi), \text{ and}$$

$$V_{320}=\text{Sigma}(Ai*\sim Bi)$$

Where $V_{310}$, $V_{320}$ represent the logic state on lines 310, 320, respectively, in negative logic notation, Ai is the vector applied on 300, and Bi is the logic value of cells 200.

In some embodiments of the present invention it may be necessary to clamp the voltage on lines 310, 320 in order to avoid the case where a cell with logic high on one of its sides, will be pulled low and flip its state, as a result of one or more neighbor cells pulling the corresponding line 310 or 320 low. The clamping voltage may be set to the lowest level which will still guarantee that the cell will not flip. Low voltage assures better noise immunity and lower current spike.

In some embodiments of the present invention, such current spike is avoided or mitigated by limiting the time duration during which lines 300 are active. Such a limit on the time duration limits, in turn, the voltage swing on lines 310, 320, avoiding the risk that the cell will flip and/or minimizing the current spike incurred by the voltage limiter. In other embodiments designed to prevent the risk of the cell flipping, we use the pocket implant invention which is described later.

In addition to the write mechanism identical to that used by standard SRAM devices, the present invention facilitates writing a vertical word into cells 200. This is typically done in two clock cycles, where in one clock cycle lines 310 are held low, and lines 300 of those cells which are to store logic one are asserted. In the second clock cycle, lines 320 are held low, and lines 300 of those cells which are to store logic zero, are asserted.

As shown, the sum of products operation is done at the same time on both lines 310 and 320; this allows some degree of parallel operation. However, both sum-of-products operations share the same Vector A, and thus the flexibility of such parallel operation is limited.

Figure 5:
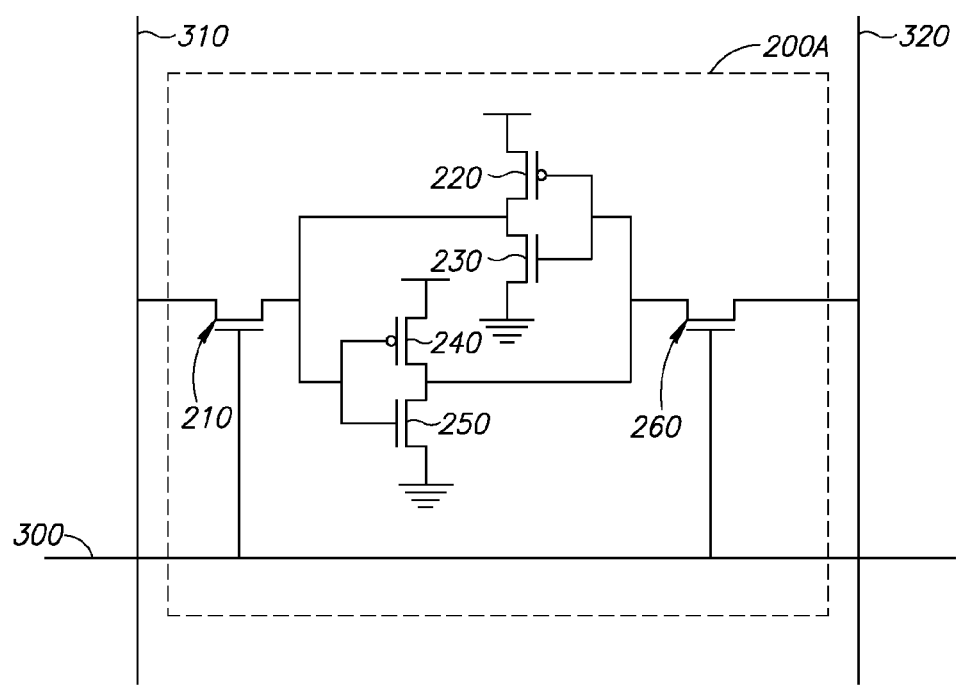
FIG. 5 illustrates an SRAM cell according to the teachings of the present invention.

FIG. 5 depicts a single SRAM cell, similar to the cell shown in FIG. 2. The same item numbers are kept. Line 300 is the R/W control line, which is also activated in sum-of-products evaluation. Lines 310 and 320 are the bit and bit-not lines, respectively.

In the following text, a cell with high level on the gates of transistors 240, 250 and low on the gates of transistors 220, 230, will be referred to as storing the value of 1; conversely, a cell with low level high on the gates of transistors 240, 250 and high on the gates of transistors 220, 230, will be said to store logic 0.

The symbol $B_{i,j}$ will refer to the logic level stored in a cell of the $i^{th}$ column (from the top), $j^{th}$ row (from the left), where counting starts from 0.

Certain embodiments of the present invention, which are based on standard SRAM cells, can be programmed to operate in one of several configurations, to be described below. Other embodiments of the present invention based on standard SRAM cells, support one or more of the configurations described below. For the sake of clarity, the description below will disregard the foregoing distinction and refer to configurations only.

Standard SRAM Based Array, 2 Cells per Bit Configuration

Figure 6:
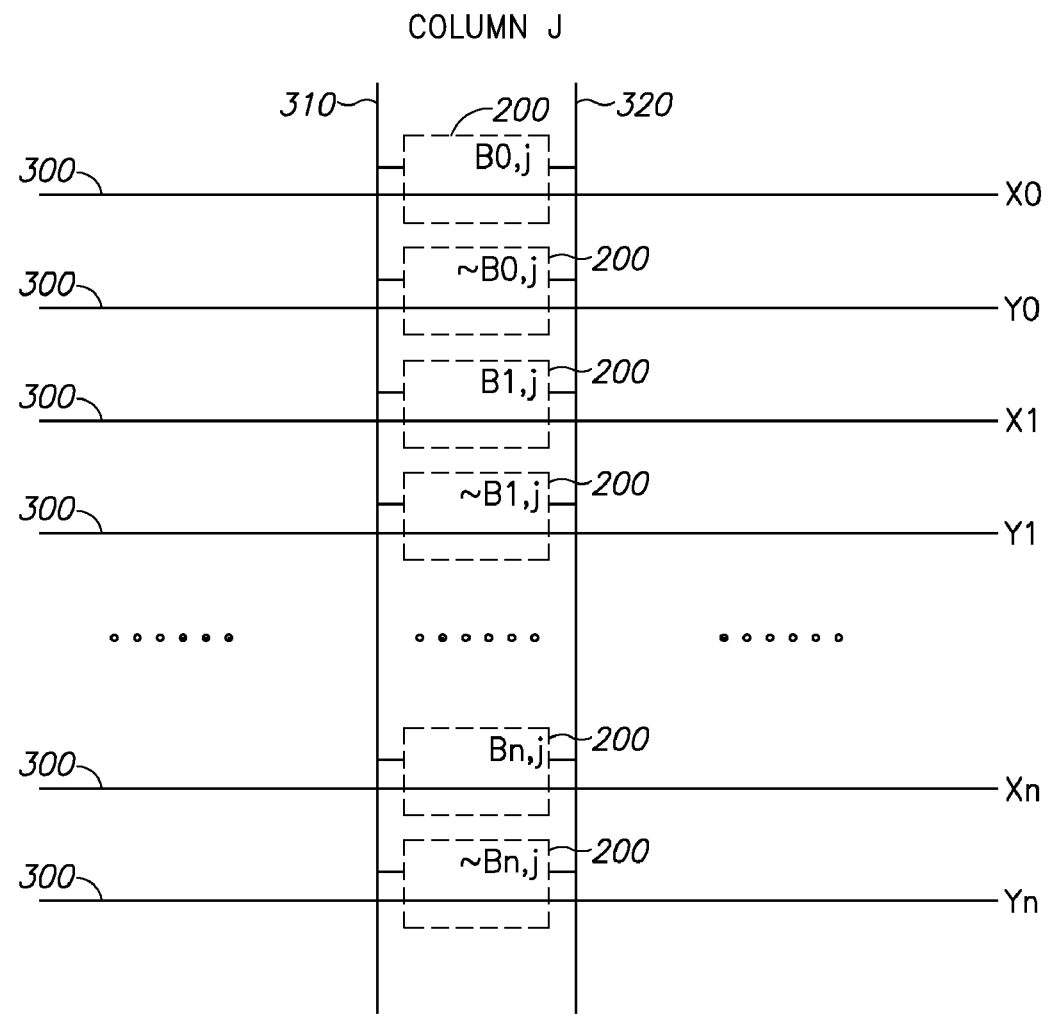
FIG. 6 illustrates a first configuration of an array based on standard SRAM cells according to the teachings of the present invention.

A first configuration is illustrated in FIG. 6. Row j of a multitude of identical columns is shown, comprising 2n identical cells 200. Each bit of vector Bi,j occupies a pair of cells 200, where one cell stores the value of Bi,j, the other cell stores the inverted value ~Bi,j.

Although the cells storing bit Bi,j and ~Bi,j for a particular j are shown as to be adjacent, there is no such restriction in the current invention; in fact, Bi,j and ~Bi,j can be placed anywhere in row j.

The array is written to and read from as ordinary RAM. CAM comparison of ternary input vector Ai with stored matrix Bi,j is done as follows:

Line 310 is precharged to a high voltage while all lines 300 are held low;

For all bits i of vector Ai, if Ai is at logic high, Xi will be driven high while Yi will remain at low; if Ai is at logic low, Yi will be driven high while Xi will remain at logic low. If Ai is at X, both Xi and Yi will remain low.

A sense amplifier located at the bottom and/or top edge of the row will sense if line 310 is pulled low, indicating that at least one unmasked bit of vector A–Ai— is not equal to the corresponding stored Bi,j value, for each column j; if line 310 remains at logic high, a full match (of all unmasked bits) is detected, between input vector A and stored vector values Bj, for each row j.

In some embodiments, a similar sense amplifier is implemented, sensing if line 320 is pulled low. This allows the concurrent detection of a match between Ai and Bi,j, and between Ai and ~Bi,j.

It should be noted that the sense amplifier described above is different from the sense amplifier used in standard SRAM arrays, as it is not differential; hence, a sense amplifier of the present invention will have two modes of operation. In some embodiments two separate sense amplifiers will be used, one for the read operation, and one for compare.

Figure 7:
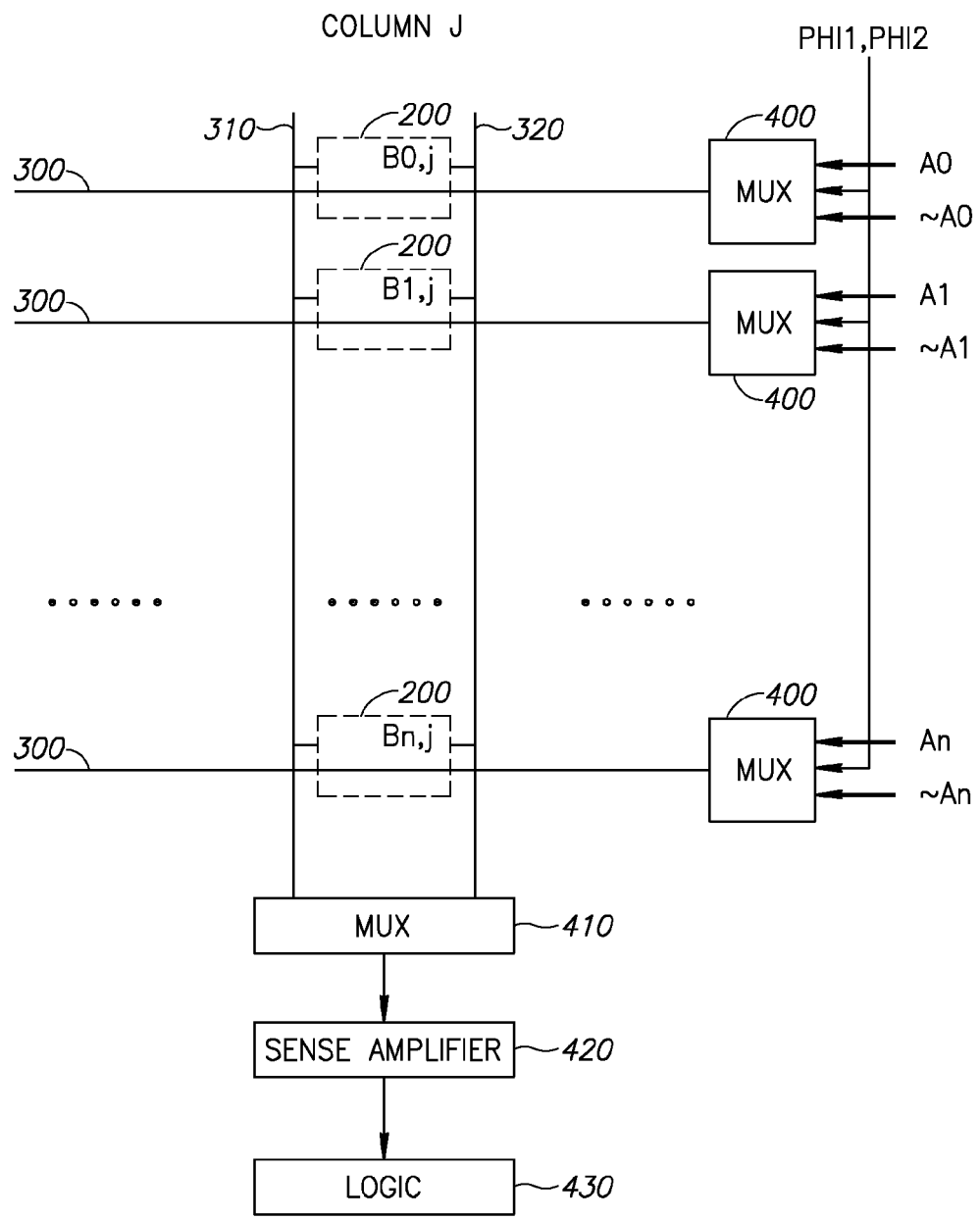
FIG. 7 illustrates a second configuration of an array of standard SRAM based CAM that utilizes one cell per bit and executes a compare operation in two clock cycles.

FIG. 7 illustrates a configuration of an embodiment of the present invention where a single storage bit is used for each stored bit Bi,j. In this configuration, two clock cycles are needed for a compare operation. It should be noted that the illustrated configuration is simplified to show only the compare operation; for read and/or write, multiplexers 400 and 410 will typically be bypassed.

Compare is done in two consequent cycles, designated PHI1 and PHI2. Multiplexers 400 introduce vector Ai on lines 300 at PHI1, and the inverse of vector Ai at PHI2. Prior to each phase lines 300 are held at logic low.

If the corresponding 300 line is at logic high, Bi,j bits at logic 0 will pull line 310 low, while Bi,j at logic 1 will pull line 320 low. As lines 300 are driven by Ai,j at PHI 1, it follows that lines 310 will be pulled low at PHI1 if there is at least one bit Bi,j at low, with the corresponding Ai at high. Similarly, as lines 300 are driven by Ai at PHI2, line 320 will be pulled low at PHI2 if there is at least one bit Bi,j at high, with the corresponding Ai bit at low.

Hence, a full match can be detected by checking that line 310 is not driven low at PHI1, and line 320 is not driven low at PHI2. Accordingly, multiplexer 410 routes line 310 to sense amplifier 420 at PHIL, and line 320 to sense amplifier 420 at PHI2.

Sense amplifier 420 checks if line 310 or 320 is pulled low. Its output is routed to logic unit 430, which indicates a match if the output from sense amplifier 420 is high at both PHI1 and PHI2.

Standard SRAM Based Array, Coded Compare

The first configuration described above uses two RAM cells for each Bi,j bit, and hence reduces the amount of available storage. The second configuration provides full array utilization, but takes two clock cycles for a compare operation, and hence sacrifices speed. In a third configuration of embodiments of the present invention, a single clock cycle per compare is retained, and the array size is only slightly enlarged; however, both stored vector Bi,j and compare vector Ai have to be translated to special code, where n bits of every m are at logic high.

Figure 8:
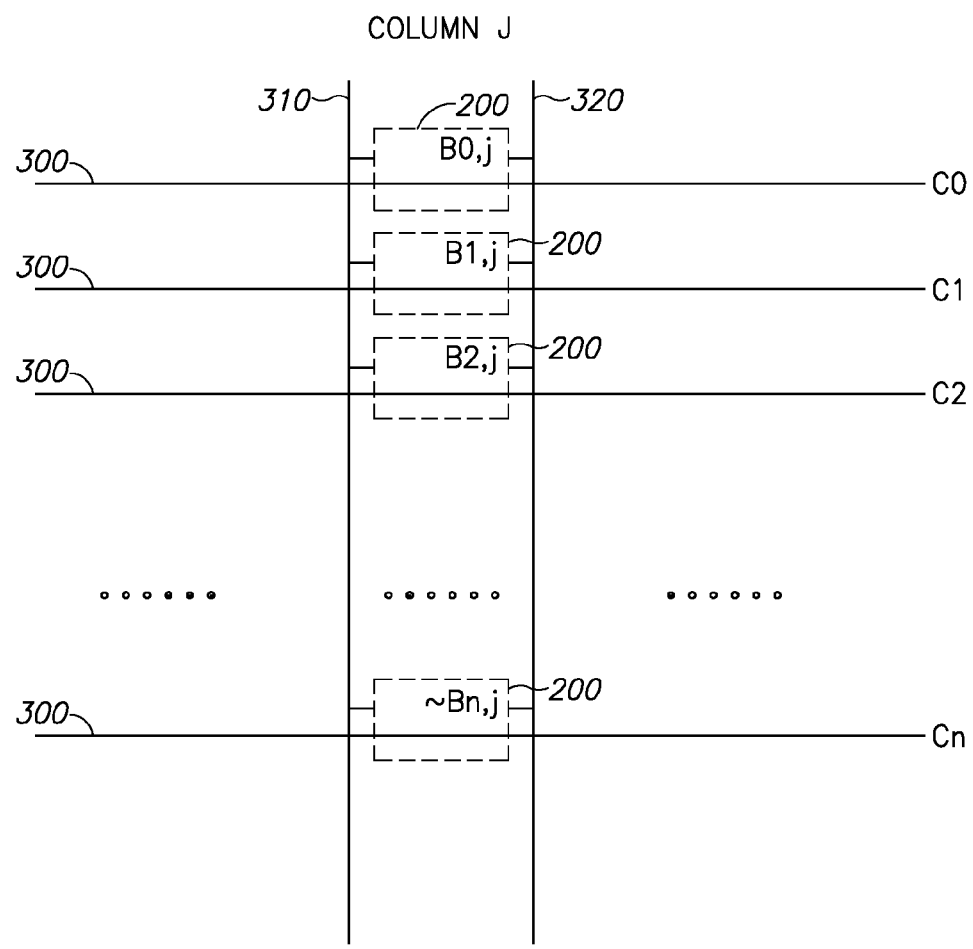
FIG. 8 illustrates a third configuration of an array of standard SRAM for performing a coded compare operation.

The array is depicted in FIG. 8, and is identical to standard SRAM. The difference is that here, as in the previous configurations, the sense amplifier does not work in the differential mode; instead it detects if line 310 is pulled low, indicating no-match.

As a fixed number of bits is at logic high, and hence a fixed number of bits is at logic low, it is sufficient to compare only the set bits (or the cleared bits); this is true because if the two vectors are different in bit i, and Ai=1, they must be also different in at least a single bit j with Aj=0, otherwise the sum of set bits will not be equal.

An example to coding is shown in Error! Reference source not found. Here a 4 bit input vector is translated to a 3-hot 6-bit code; that is—a code where exactly 3 of 6 bits are at logic high.

TABLE 1

Coding Example

|  | A5 | A4 | A3 | A2 | A1 | A0 |
| --- | --- | --- | --- | --- | --- | --- |
| 0000 | 0 | 0 | 0 | 1 | 1 | 1 |
| 0001 | 0 | 0 | 1 | 1 | 0 | 1 |
| 0010 | 0 | 0 | 1 | 0 | 1 | 1 |
| 0011 | 0 | 1 | 0 | 0 | 1 | 1 |
| 0100 | 0 | 1 | 0 | 1 | 0 | 1 |
| 0101 | 0 | 1 | 0 | 1 | 1 | 0 |
| 0110 | 0 | 1 | 1 | 0 | 0 | 1 |
| 0111 | 0 | 1 | 1 | 0 | 1 | 0 |
| 1000 | 0 | 1 | 1 | 1 | 0 | 0 |
| 1001 | 1 | 0 | 0 | 0 | 1 | 1 |
| 1010 | 1 | 0 | 0 | 1 | 0 | 1 |
| 1011 | 1 | 0 | 0 | 1 | 1 | 0 |
| 1100 | 1 | 0 | 1 | 0 | 0 | 1 |
| 1101 | 1 | 0 | 1 | 0 | 1 | 0 |
| 1110 | 1 | 0 | 1 | 1 | 0 | 0 |
| 1111 | 1 | 1 | 0 | 0 | 0 | 1 |

Rather than using 4 lines for vector Ai and another 4 for ~Ai, or a total of 8 lines, only six lines are needed for the coded vector.

In this case the saving in area is 25%. It should be noted that for longer vectors, better savings ratios can be achieved. For example, a 9-bit vector needs 12 bits of code (using 512 of the 792 5-hot codes, or 512 of the 924 6-hot codes); in this case the saving is 33%. For 17 bit input vectors the saving is more than 41%. For very large vectors the savings approaches but never reaches 50%.

However, for large vectors, the translation from the input vector or the vector to be stored to the n-of-m code, whether done in hardware or in software, may be complex. Therefore, in practical embodiments of the present invention, larger vectors are divided to smaller vectors; e.g. a 64 bit input vector may be split to eight, 8-bit vectors, each coded independently to 4-hot 11 bit codes, with the full 64 bit vector consuming 88 lines, rather than 128 according to the first configuration above.

In coded compare configurations, masking is not possible in either the stored matrix Bi,j or the input vectors A. However, when coding is done in several groups independently, then for each such group a global mask is possible, by programming all Bi,j bits of that group to 1 for the store bits, or by forcing all 300 lines to 0, for Ai.

In some configurations, Bi,j is divided to several fields, where in different fields different coding (or no coding) could be done.

Configuration 2: Modified SRAM Based Array

Figure 3:
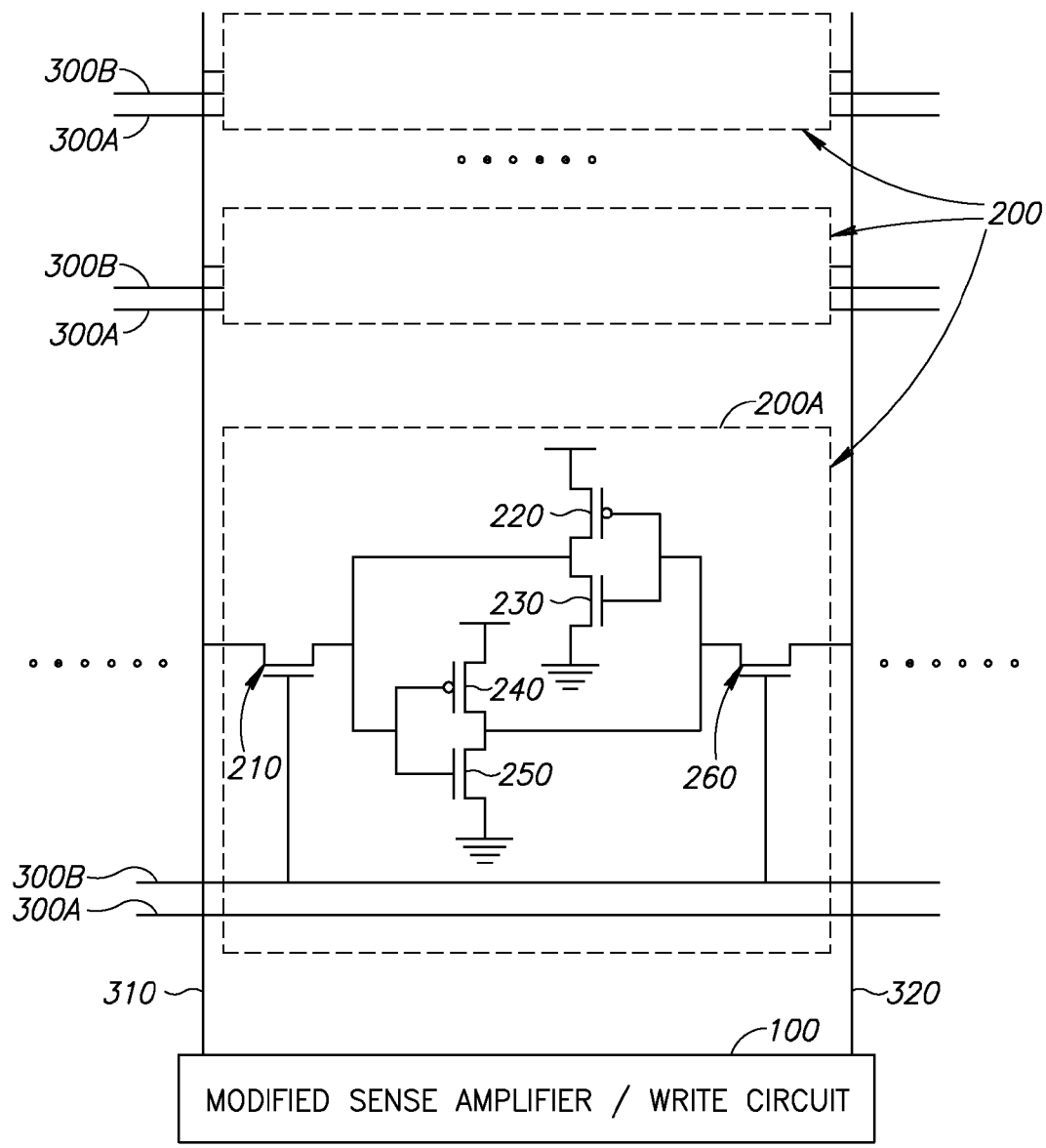
FIG. 3 is a circuit diagram of a modified SRAM cell according to the teachings of the present invention.

In order to allow for more flexibility, some embodiments of the present invention use a modified SRAM cell, as depicted in FIG. 3.

The circuit is similar to that depicted in FIG. 2, and for ease of reference we use the same numbering for the same devices. The difference is that horizontal lines 300 are now split into pairs—300A and 300B, where lines 300A are used to enable device 210 and access the left side of the cell, while lines 300B are used to access the right side of the cell.

This deviation from the standard SRAM circuit allows increased functionality of the circuit. By forcing both vertical lines 310, 320 to zero and then activating lines 300A in some of the rows, lines 300B in other rows, and in yet other rows not activating lines 300A or 300B, any value can be written into selected bits of a row Bj (or several rows Bj) of the array, taking one clock cycle.

Moreover, two concurrent sum-of-product operations can be evaluated, at both sides of the array: Ai*Bi and Ci*Bi, where A and C are two independent one-dimensional bit vectors.

In certain embodiments of the present invention, the RAM cell is slightly modified, to allow dense one-bit-per-cell storage, single clock compare, and full ternary flexibility.

Figure 9:
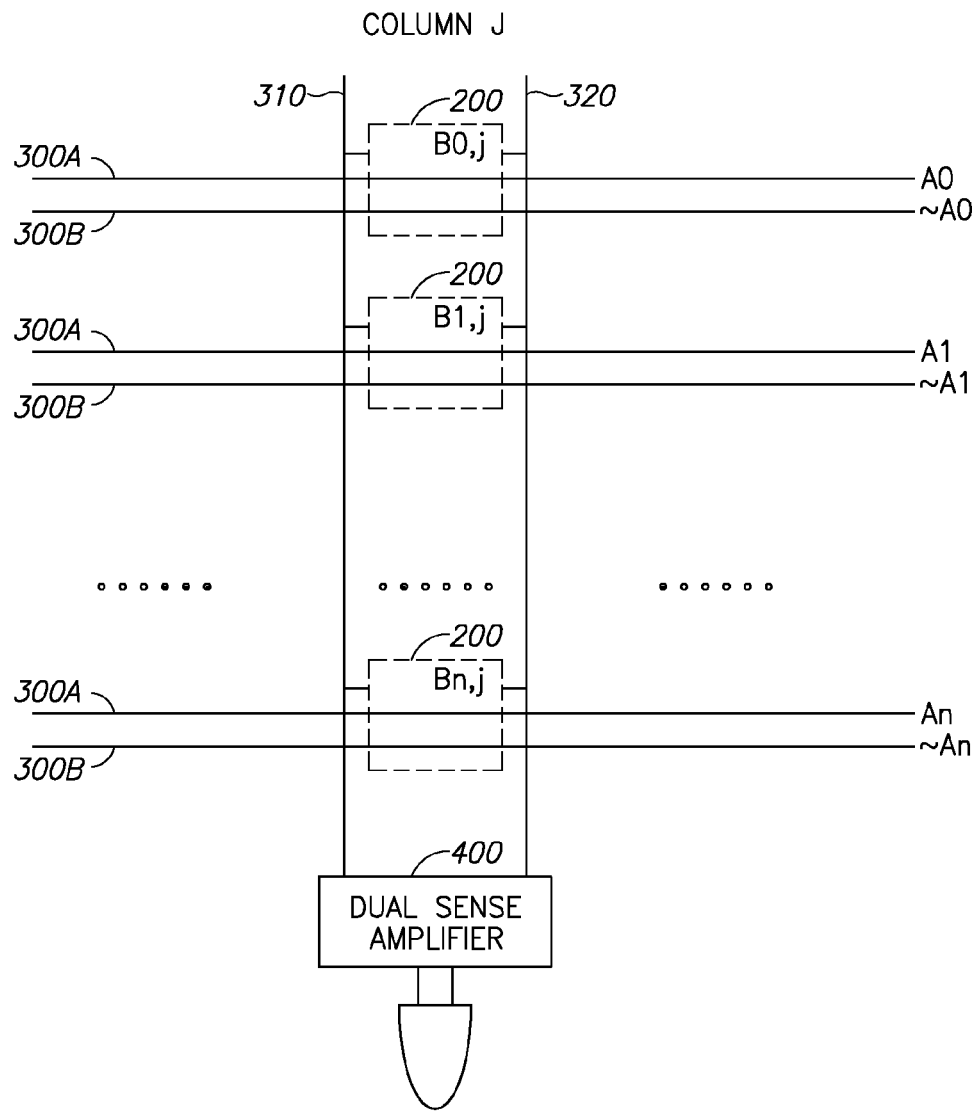
FIG. 9 illustrates an array of slightly modified SRAM cells according to preferred embodiments of the present invention.

The cells of such an array are described with reference to FIG. 3. The array is depicted in FIG. 9. For SRAM read and write operations, lines 300A and 300B are always driven with the same value. For compare operations, for every bit of input vector Ai=1, the corresponding 300A line is driven high, and for every bit Ai=0, vector 300B is driven high. For masked bits, both 300A and 300B will remain at logic low.

The operation is similar to that of the non-modified SRAM-based configuration, but rather than using two clock cycles, both compares are done at the same clock cycle, by feeding Ai to line 300A and ~Ai to line 300B, concurrently.

The sense amplifier comprises two identical single-ended parts (in addition to the differential circuit used for read operations). If any of lines 310, 320 conducts, indicating that that there is a cleared bit in Bi,j for which Ai=1 for the 310 line, and that there is a set bit in Bi,j for which the Ai=0 for the 320 line, the corresponding half of dual sense amplifier 400 will assert low at its output, and the AND gate will be low, indicating no match.

Configuration 3: DRAM Based Array

Figure 4:
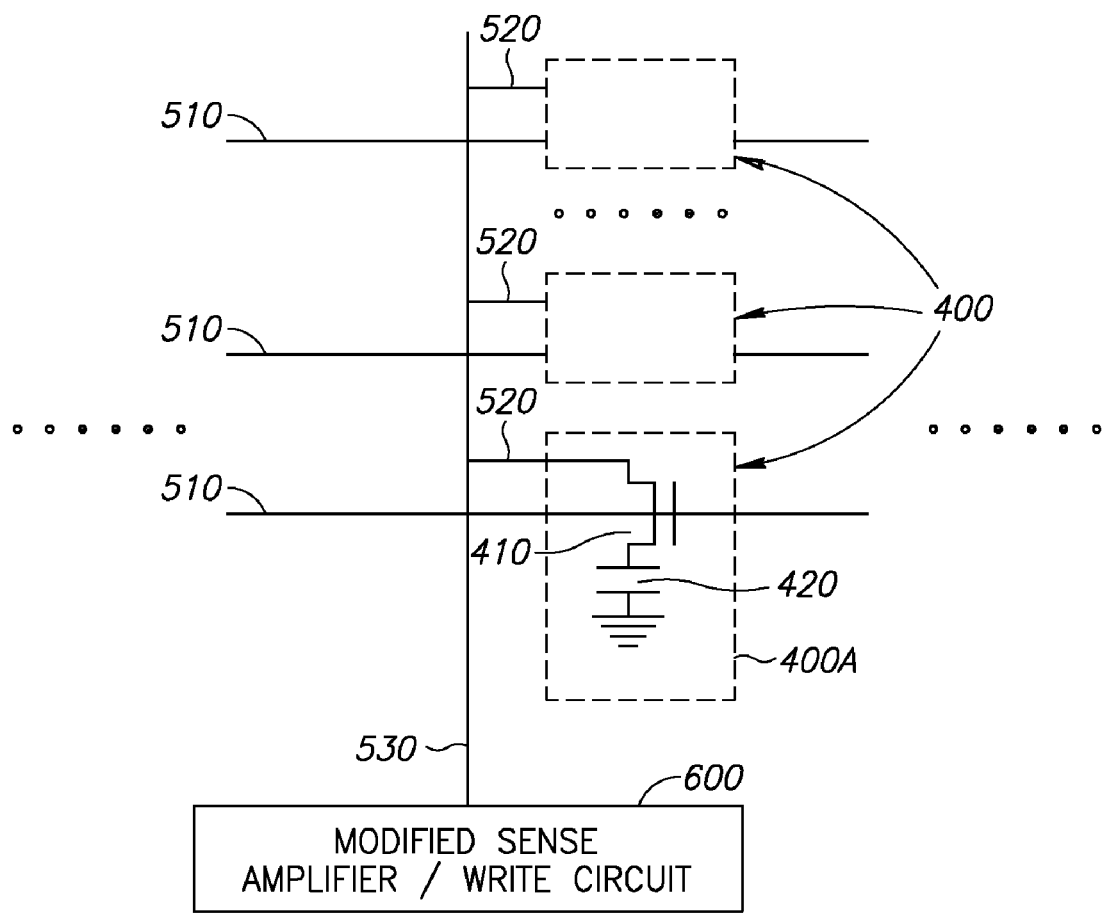
FIG. 4 is a circuit diagram of a DRAM cell according to the teachings of the present invention.

FIG. 4 depicts a structure of a DRAM based array according to yet another embodiment of the present invention.

As would be appreciated by those knowledgeable in the art, cells 400 and their arrangement into an array are identical to standard DRAM techniques, and hence latest DRAM technologies can be employed, for better performance and lower size.

Read and write operations are done in a way identical or very similar to the way they are done in standard DRAM memories. For both read and write, high voltage is applied on one of the 510 lines. In the case of a write-0, vertical line 530 is forced to a low voltage; transistors 410 in the selected columns (bit positions i with single row Bj) will turn on, and capacitor 420 will be discharged. In the case of a write-1, vertical line 530 will be set to a high voltage, and capacitor 420 will charge.

For a read, line 510 is charged high. Line 530 is precharged and then the sense amplifier senses its voltage, which will be lower in the case that capacitor 420 is charged low than it would in the case that capacitor 420 is charged high.

Reading is typically destructive, and hence followed by a write cycle, to restore the charge.

In certain embodiments of the present invention, sum-of-products evaluation is done by precharging line 530, and then simultaneously applying logic high to the 510 lines corresponding to set positions of Vector A. Vector B is the data stored on capacitors 420. Line 530 will remain charged if and only if sum-of-products Ai*Bi (within row Bj) evaluates to 1.

For said embodiments, however, sum-of-products evaluation may be destructive. If a charge restoration cycle is activated after sum-of-product evaluation and at least one but not all of the cells for which line 510 is high, are at logic low, other cells for which line 510 is high will be discharged. If charge restoration is not activated, cells with logic low may lose their charge.

In certain embodiments of the present invention, destructive sum-of-products evaluation is not desirable. In those embodiments, sum-of-products evaluation is done on each bit position i separately, by executing multiple DRAM read cycles—at each cycle one bit position (Bi) is evaluated to corresponding bit Ai. This operation executes on a plurality of rows Bj concurrently, but in each row Bj only on bit, Bi,j is evaluated. In this way, the destructed Bi,j value can be restored after the evaluation is done. This operation evaluates separate products from the each bit position in the desired sum-of-products operation for which Ai is 1. The sum (logic OR) function, in those cases, is then executed sequentially at the modified-sense-amplifier unit.

For example, if sum of products Ai*Bi is to be evaluated, and Vector A has bits 0, 5 set and the others cleared, the following sequence will take place A0 will be set, resulting in a read of B0 value onto line 530. The result will be stored in a storage element within the sense amplifier. If it is low, subsequent read operations will not change its value, which will remain low until the current sum-of-products evaluation is completed.

A5 will be set, resulting in a read of B5 value onto line 530. The storage element in the sense amplifier will assume a low voltage level if the current read value is low, which will not change for the remainder of the sum-of-products evaluation.

The storage element, which is initially set to high, will remain high at the end of the sum-of-products operation only if all products read are high.

It should be re-noted that negative logic is used here, in terms of stored data and in the term of sum-of-products. In Boolean algebra notation, cell Bi drive is:

$$Di = Ai*Bi + \sim Ai = Bi + \sim Ai$$

The sum-of-products is evaluated to 1 if all read Di elements are at 1:

$$SOP = PI(Di)$$

$$SOP = PI(Bi + \sim Ai)$$

Using De-Morgan:

$$\sim SOP = SIGMA((\sim Bi)*Ai)$$

Or, the SOP, in negative logic, is equivalent to the sum of products of Ai elements and negative-logic value of Bi elements.

Figure 10:
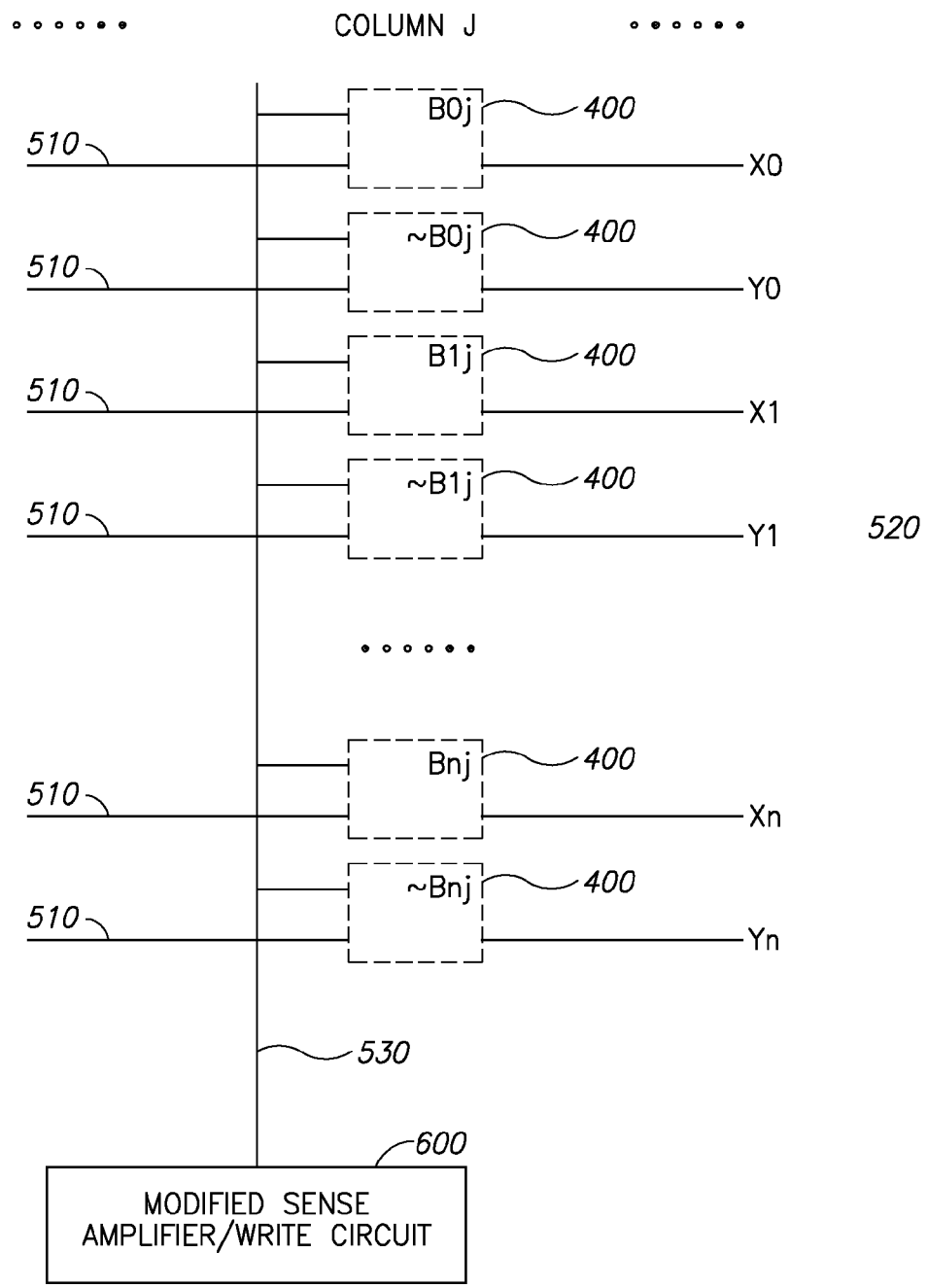
FIG. 10 illustrates an array of DRAM cells according to preferred embodiments of the present invention.

FIG. 10 depicts the structure of a DRAM based array, based on cells described in FIG. 4. One row is shown, out of a multitude of rows sharing the same horizontal 510 lines.

Two cells are used for every bit of Bi,j, where the first cell stores the value of Bi, and the second cell stores the value of ~Bi. A cell is said to store logic one if its capacitor is charged high.

The array is written and read in the same way a standard DRAM is read or written. The compare operation, however, is different.

In certain embodiments of the present invention, destructive compare operation is allowed. In those embodiments, a compare operation is done by precharging lines 530, and then applying logic high on all Xi lines for which Ai=1, and applying logic 1 on all Yi lines for which Ai=0.

If there exist cells with stored low voltage and high on the corresponding 510 line, line 530 will be pulled low, indicating no-match, which will be detected by modified sense amplifier 600. Line 530 will remain charged only if for all Bi,j lines at logic 1—that is—with 1 stored in Bi,j and 0 stored in ~Bi,j, Yi will be low, and Xi will be high, and for all Bi,j lines at logic 0—that is—with 0 stored in Bi,j and 1 stored in ~Bi,j, Yi will be high, and Xi will be low.

Such compare operation will be destructive, as some cells with stored 0 will be charged. Such loss of charge also occurs in the case of a standard DRAM read cycle; however, in a standard DRAM, a read is followed by charge restoration phase, which is not possible here as several cells are connected to the same line 530, and only those with stored low should be refreshed.

In other DRAM based embodiments, destructive compare operation may not be desired, or may not always be desired. Such embodiments have a special sequential-or logic in the sense amplifier, and perform sequential compare operations as follows: for every unmasked bit of vector B, a partial compare is done by applying high level on Xi if Ai=1, and on Yi if Ai=0. The sense amplifier senses the level of line 530. The sense amplifier will indicate that a match is detected if for all partial compare operations of all unmasked bits, line 530 will not be discharged. If at any of the partial compare operation line 530 is discharged, the match will fail.

Coded DRAM Based Architecture

In some DRAM based embodiments, and in alternative configurations of the DRAM based embodiments described above, coding may be employed, to reduce the storage size from 2 cells for each bit to a lower number, as described in the Standard SRAM Based Array, Coded Compare configuration above. As would be appreciated by those knowledgeable in the art, the techniques described above are applicable for DRAM based embodiments as well.

Layout Considerations

In some embodiments of the present invention based on standard DRAM cells the horizontal pitch of the cells is narrow and some of the sense amplifiers are located on one vertical edge of the array, while others are located on the other vertical edge. In particular, in certain embodiments, odd numbered sense amplifiers, of columns 1, 3, 5, and so on, are located at the bottom of the array, while even numbered sense amplifiers, of columns 0,2,4 and so on, are located at the top of the array.

Configuration 4: Differential Sense Amplifiers

In some embodiments a Unipolar sense-amplifier as described above is not required. A differential functionality for the sense amplifier may be preserved.

The basis for the SRAM-based embodiments of the present invention is the observation that SRAM cells are highly symmetrical, so that the bit-line drive capabilities of both sides of the SRAM cell are fairly matched to each other. Another assumption is that the drive capability of various cells in the same row (e.g., storing value Bj) is also fairly matched.

In order for this embodiment to be useful, suffice it to constrain the SRAM design so that that the ratio between the strongest and the weakest bit-line drivers in a given column at the same operating conditions will be less than 50%. If better matching can be guaranteed, e.g. 20%, the present invention will offer considerably more functionality.

We refer to the current forced into a bit line from a cell with stored 1 (in the junction adjacent to said bit line) as Iu. We refer to the current drawn from a bit line by a cell with stored 0 (in the junction adjacent to said bit line) as Id. We refer to current flowing from the cell to the bit line as positive current, and to current flowing from the bit line to the cell as negative current. The currents for SRAM cell are illustrated in FIG. 11.

Figure 11:
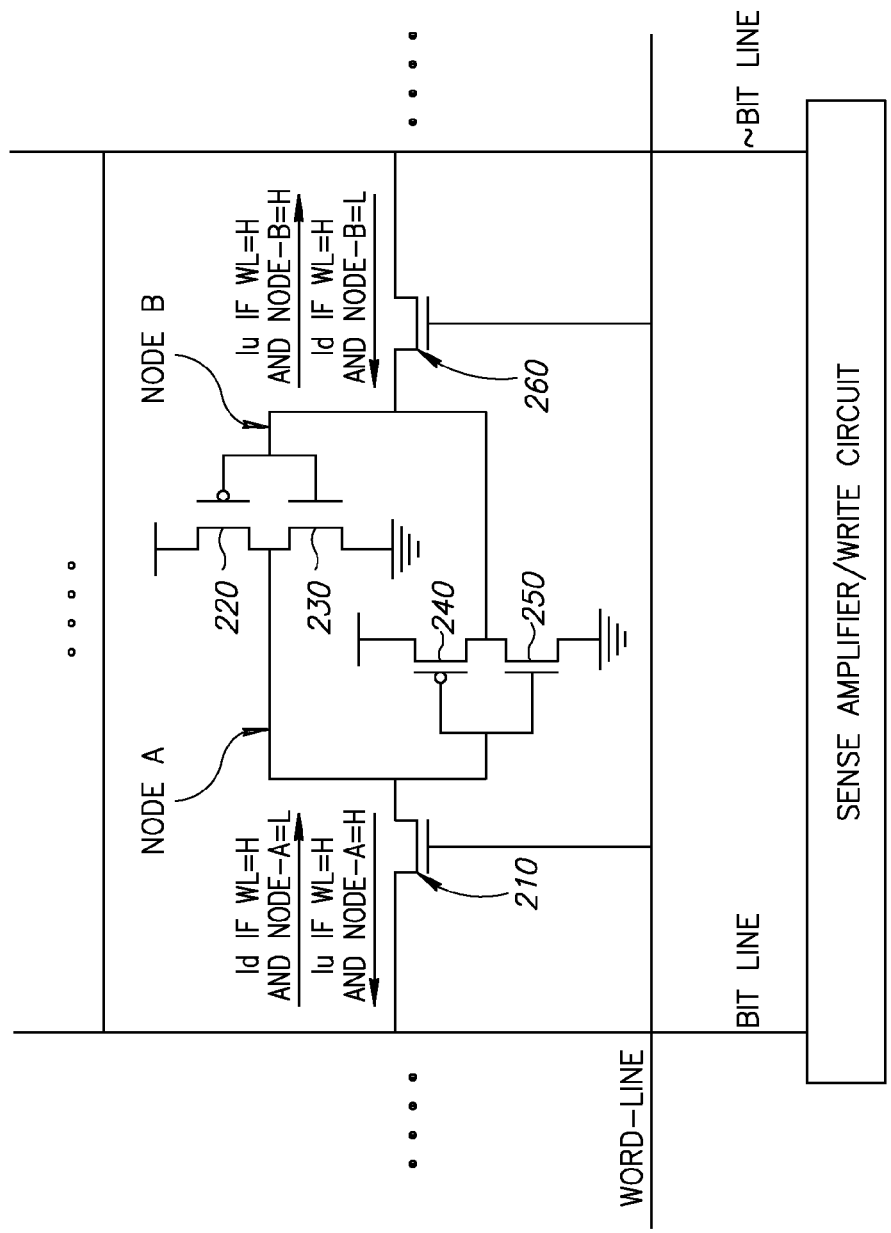
FIG. 11 illustrates a standard SRAM cell and the terminology used to describe its parts.
Figure 12:
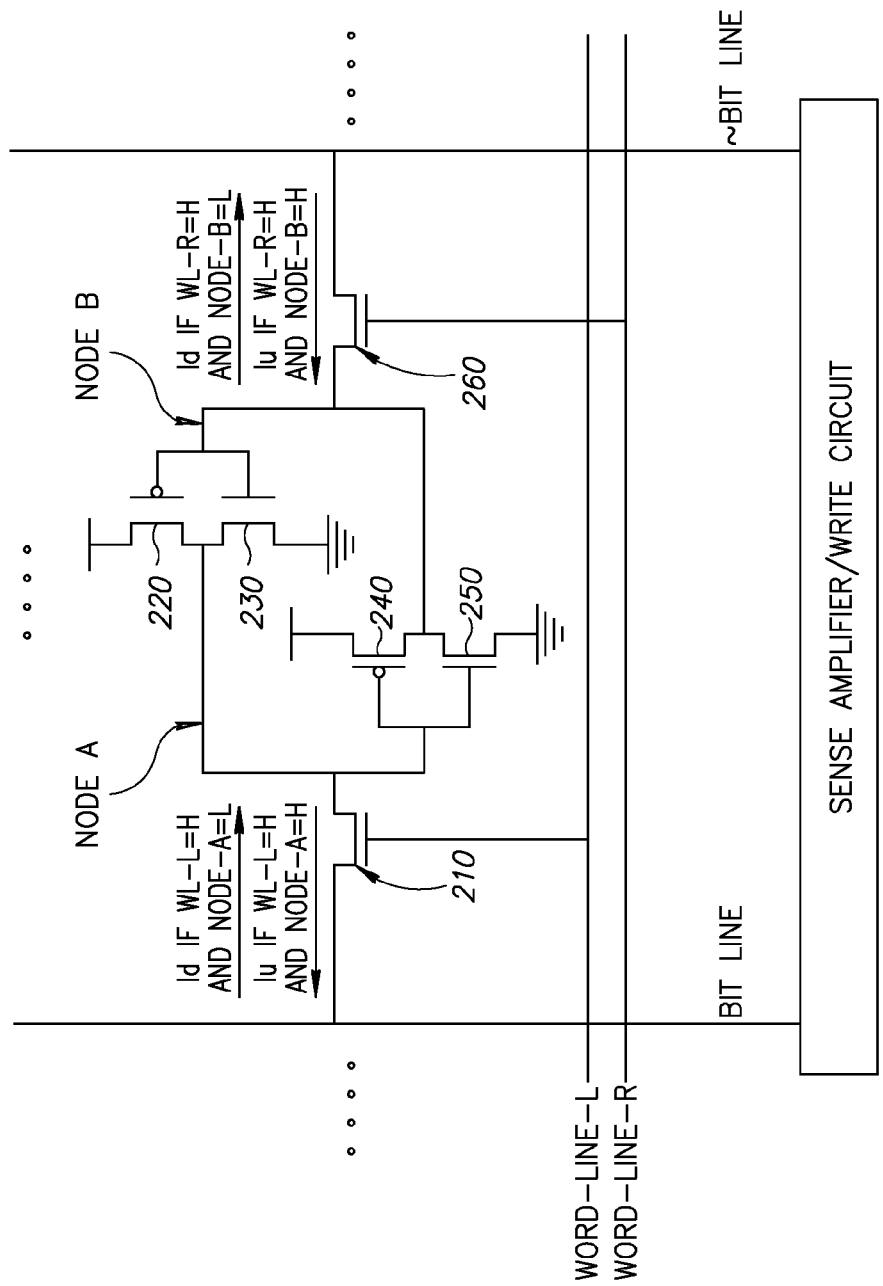
FIG. 12 illustrates an SRAM cell modified according to the teachings of the present invention and the terminology used to describe its parts.

For the modified SRAM cell depicted in FIG. 12, we use the same terminology as in describing FIG. 11. Note that the word line connecting the cell to the bit-line on the left is designated word-line-L (or WL-L), and that the word line connecting the cell to the bit-line on the right is designated word-line-R (or WL-R).

Principle

By the concurrent activation of more than one word line, several cells in each row (e.g., in each value Bj) will be coupled to the bit-line and/or the ~bit-line of each row.

The currents are summed at the bit and ~bit lines. Their accumulated effect is commonly translated to a voltage, and the sign of the difference in voltages between the bit line and ~bit line is detected by differential sense amplifiers.

Similar to the arrays described above, the bit lines may be equipped with voltage dampers, which limit the discharge voltage so as to assure that no cell with stored high will be flipped.

In standard SRAM cells, with one word line per cell, if the number of cells with stored 1, and with the corresponding bit line set equals n, the total current in the bit line will be n*Iu, and the total of current in the ~bit-line will be −n*Id, in both cases a positive sign indicates current flowing from the cell to the bit line or ~bit line. The contribution of said cells to the difference in currents is n*(Iu+Id).

Similarly, if the number of cells with stored 0, and with the corresponding bit line set, equals m, the total current in the bit line will be −m*Id, and the total of current in the ~bit-line will be m*Iu. The contribution of said cells to the difference in currents is −m*(Iu+Id).

It follows that the difference in currents will be (n−m)*(Iu+Id). Hence, the output of the sense amplifier will indicate if n>m.

For modified SRAM cells with two word lines, for a particular cell, if nl is the number of cells storing high with WL-L set, they will contribute to the current in the bit line nl*Iu. If ml is the number of cells storing low with WL-L set, they will contribute to the current in the bit line −ml*Id.

Similarly, if nr is the number of cells storing high (and hence their complement, stored in the right side, is low), with WL-R set, they will contribute to the current on ~Bit Line −nr*Id. If mr is the number of cells storing low with WL-R set, they will contribute to the current on ~Bit Line mr*Iu.

The difference in currents between the bit-lines and the bit-lines will be:

Idiff=Iu(nl−mr)−Id(ml−nr).

For example, if for every selected row, both WL-L and WL-R are activated, nl=nr=n and ml=mr=m, and we get:

Idiff=n(Iu+Id)−m(Iu+Id)=(n−m)(Iu+Id), i.e. the same result as that obtained for the SRAM cell, with half the number of cells.

Differential Compare

According to preferred embodiments of the present invention, comparison of the stored vector to a given input vector can be done using a differential sense amplifier, as opposed to a uni-polar amplifier which was described earlier. Consequently, compare operations can be done at the same speed as regular RAM read operation.

We assume that each bit is stored in two cells, one storing the value of the bit, and the other storing the negated value of the bit. In addition, several cells in each column store logic 0. In some embodiments of the present invention those cells could be cells which are used for other purposes, but their value may be known to the programmer at a certain point in time. In other embodiments, those are extra cells. The number of such cells should be equal to the maximum number of members in a comparison operation, minus 1.

Figure 13:
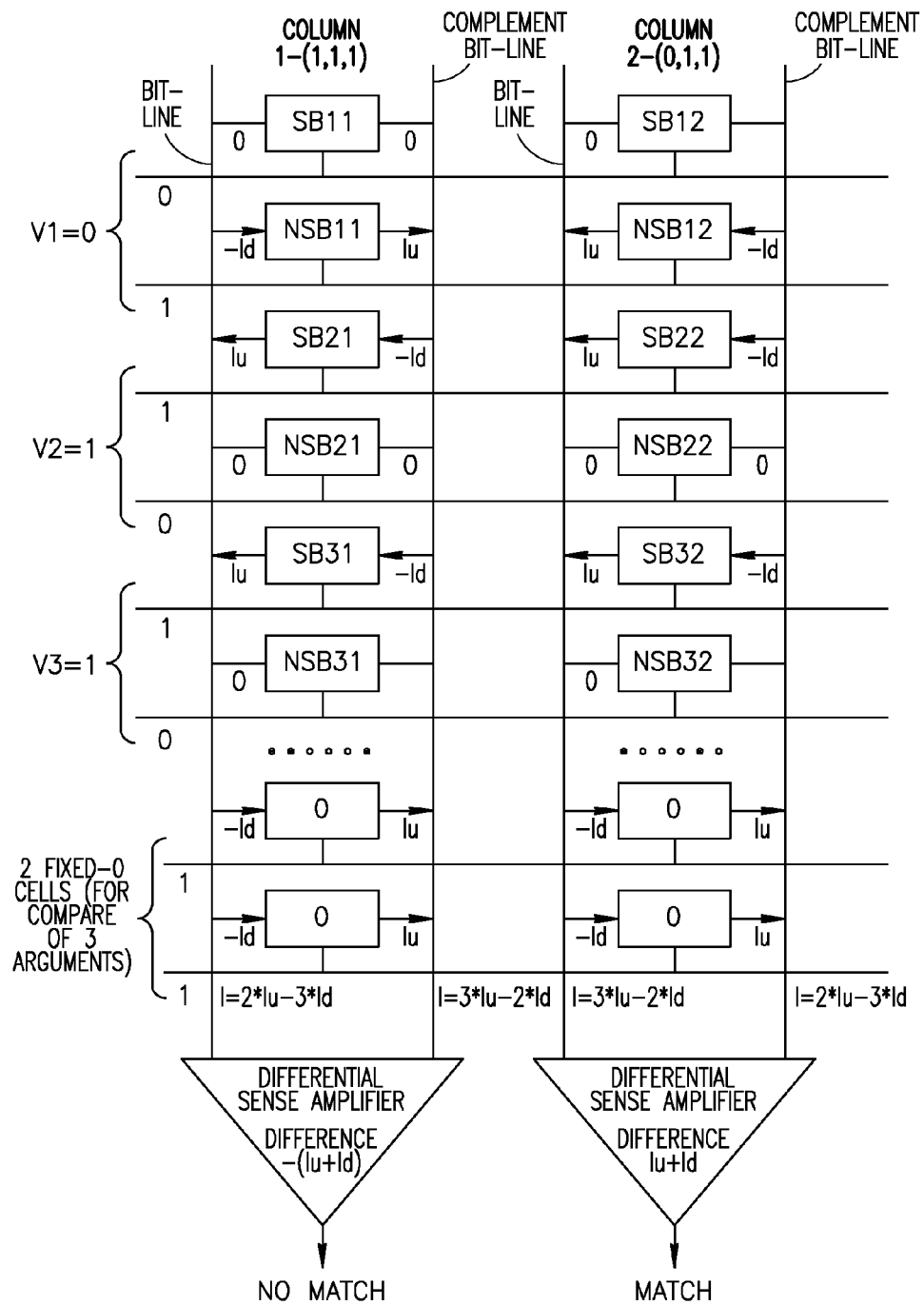
FIG. 13 illustrates an example differential compare operation executed according to the teachings of the present invention.

An example to differential compare is depicted in FIG. 13. Two columns are shown; in the left column bits {B1,B2, B3}={1,1,1}, and in and the second column bits {B1,B2, B3}={0,1,1}. The vectors are compared with an input vector V={0,1,1}.

A control circuit (not shown) drives the word lines according to input vector V. As the first element of Vector V is at logic 0, the word line connected to cells NSB11, NSB12 is activated. As the next two bits of vector V are at logic 1, the word lines connected to SB21, SB22 and SB31, SB32 will be activated. In addition, as the number of compared bits is three, two cells with stored 0 in each column will be activated.

In each column, each matched bit will source Iu into the bit-line, and sink Id from the complemented-bit-line. Each non-matched bit sources Iu into the complemented-bit-line, and sinks Id from the bit-line. In addition, each of the two fixed-0 cells will source Iu into the complemented-bit-line, and sink Id from the bit-line, with the effect of two non-matched cells.

It follows that, when the current sourced into the bit-line and the complemented-bit-line are compared, the result will be positive only for columns where there is a match in all three bits.

In the example illustrated in FIG. 13, as there are only two matching bits in the left column, the total current sourced into the bit line is 2*Iu-3*Id, and the current sourced into the complemented-bit-line is 3*Iu-2*Id, with a negative difference of —(Iu+Id), while in the right column, where all bits match, the difference is positive (Iu+Id).

Quantity Comparison

Again we assume that each bit is represented by two cells—one storing the value of the bit, to be referred to as SBi, and the other storing the value of the complement of the bit, to be referred to as NSBi. Jointly, an SBi cell and the corresponding NSBi, will be referred to as Bi, with the understanding the SBi=Bi and NSBi=~SBi.

A quantity comparison function compares two equal-size subsets of a stored vector, comprising a multitude of stored bits, in parallel for all stored vectors. For example, if the vector elements are B1 to B9, a first subset could comprise the elements (B1, ~B2, B4), corresponding to the values stores in SB1, NSB2 and SB4; and a second subset could comprise the elements (B6, ~B7, ~B8), corresponding to the values stored in SB6, NSB7, NBS8.

A common input vector V is applied to all columns. Vector V includes binary values for each element of the first and the second subset.

We will refer to a first subset of elements referring to NSB as negated-elements, and to a second subset referring to SB as non-negated-elements. The case where a non-negated element has a corresponding input vector bit at logic 1, and that when a negated member has a corresponding input vector bit at logic 0, will be referred to as a match.

The quantity comparison function determines if the number of matches for the first subset is greater than that for the second subset, concurrently for all stored vectors.

According to the present invention, the quantity comparison function is governed by a control circuit (not shown). For the first subset, the control circuit activates all word lines connected to SB cells corresponding to input vector bits Vi=1, and all word lines connected to NSB cells corresponding to input vector bits Vi=0. For the second subset, it activates word lines connected to SB cells corresponding to Vi=0, and word lines connected to NSB cells corresponding to Vi=1.

Figure 14:
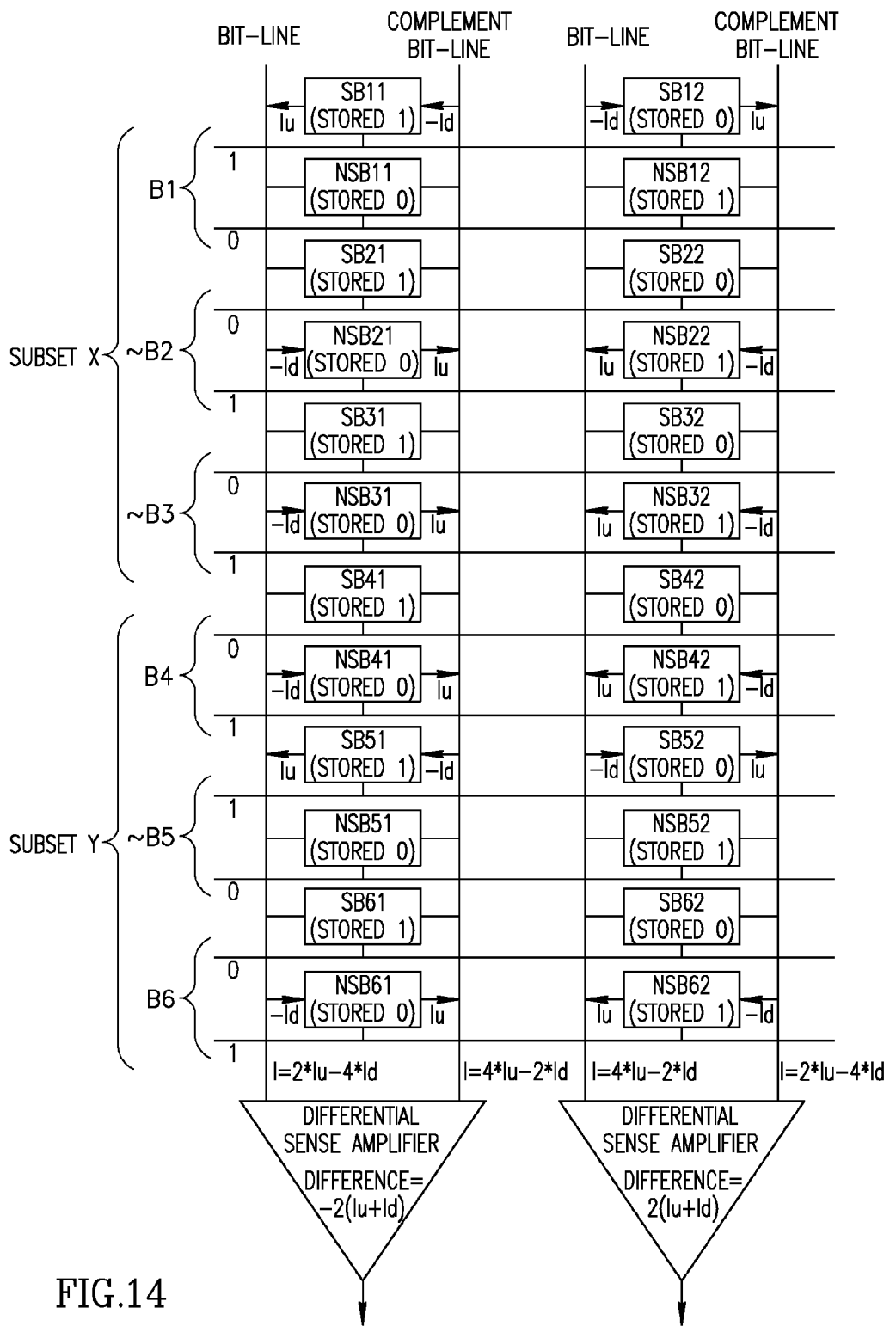
FIG. 14 illustrates an example of a quantity comparison operation executed according to the teachings of the present invention.

FIG. 14 depicts an example of a quantity comparison. There are two 6-bit columns. The left column has all bits at logical, and the right column has all bits at logic 0. In this example, subset X comprises {B1, ~B2, ~B3}, and subset Y comprises {B4, ~B5, B6}. For the first subset bit lines connected to SB1, NSB2 and NSB3 are activated. Bits with a match, i.e. B11 in the left column and B22, B32 in the right column, will source current Iu into the bit line of the corresponding column, and sink current Id from the complement bit line of the corresponding column. Bits with no-match will source current Iu into the complement bit line of the corresponding column, and sink current Id from the bit line of the corresponding column.

For the subset Y, comprising {B4, ~B5, B6}, the inverse operation is executed: bit lines connected to NSB4, SB5 and NSB6 are activated. Bits with a Match; i.e. B41, B61 in the left column and B52, in the right column, will source current Iu into the complement bit line of the corresponding column, and sink current Id from the bit line of the corresponding column. Bits with no-match will source current Iu into the bit line of the corresponding column, and sink current Id from the complement bit line of the corresponding column.

By simple arithmetic manipulation, it can be shown that difference in currents between the bit line and the complement bit line will equal to twice the differences in number of matches between subset X and subset Y, multiplied by the sum Iu+Id.

Majority Function

A majority function is a special case of the quantity comparison described above. In order to concurrently determine if most of the elements of a given subset in each stored vector are at logic 1, the word lines corresponding to the subset is activated.

Figure 15:
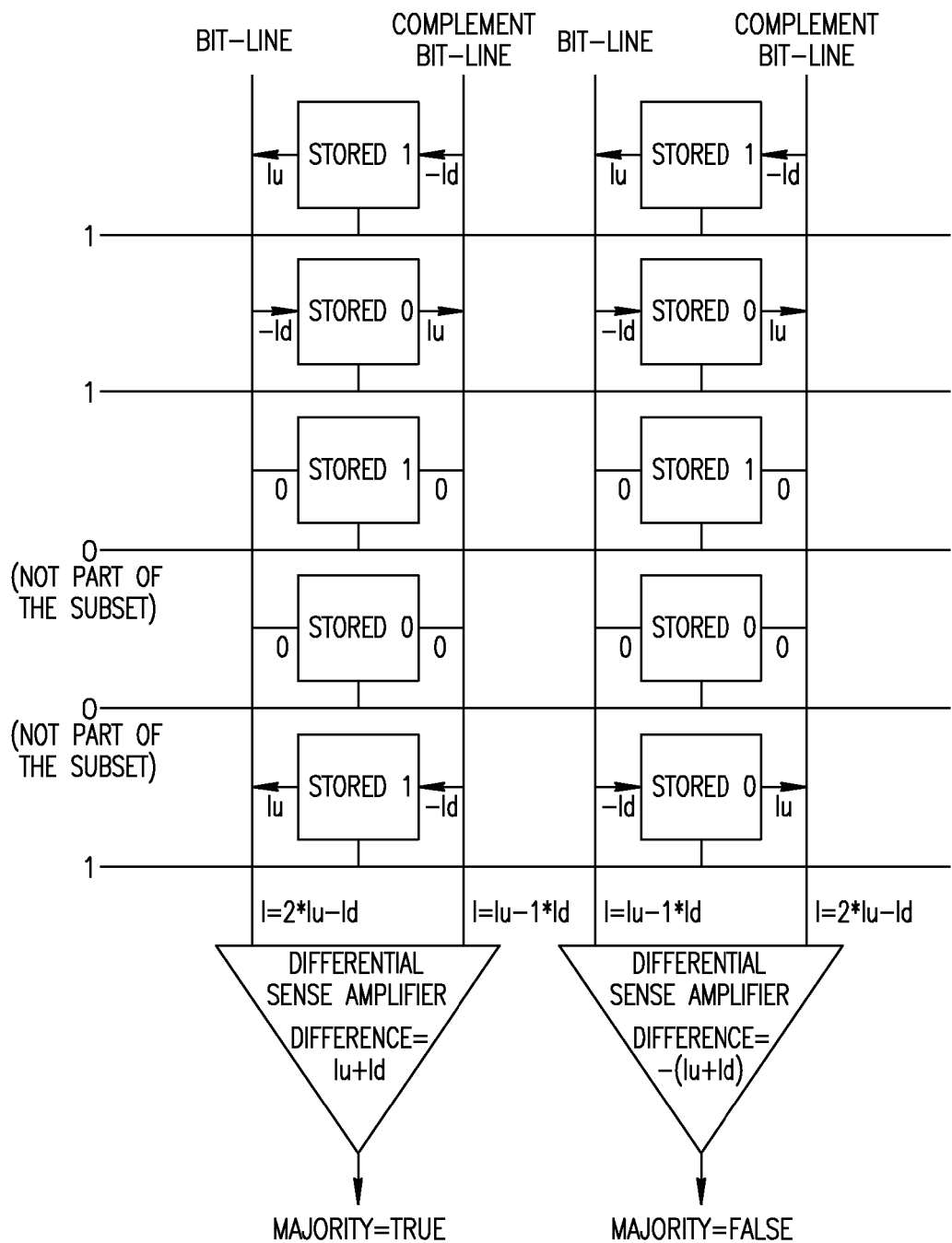
FIG. 15 illustrates an example of a majority function operation executed according to the teachings of the present invention.

This is depicted in FIG. 15. The subset for which the majority function is evaluated includes the first, second and fifth rows. Their word-lines are activated. The left sense amplifier shows that in the left column, the majority of the bits corresponding to said subset are at logic 1. The right sense amplifier indicates that, for the right column, the majority of the bits corresponding to the subset are at logic 0.

It should be noted that bits representation in this case is not necessarily 2 cells per bit; in fact, any representation scheme could be used, as this function deals with majority of cells rather than bits.

Circuits Based in Slightly Modified SRAM Cells

Other embodiments of the present invention use slightly modified SRAM cells, having two word lines for each cell, with one bit line connecting the cell to the bit-line, and the other connecting the cell to the complemented-bit-line.

Those embodiments are similar to the embodiments using standard SRAM cells described above, with one difference—while in standard SRAM embodiments a stored bit occupies two cells, one storing the value of the bit and the other storing the complement of the bit, in modified-SRAM embodiments such bit occupies a single cell; the word line which connects to the cells storing the bit values in standard SRAM embodiments is replaced, in the modified SRAM embodiment, by a word line which connects the cell to the bit line, and the word line which connects to the cells storing the complemented bit values in standard SRAM embodiments is replaced, by a word line which connects the cell to the complemented-bit line.

Notes

To avoid confusion, it should be noted that, as Id is usually much larger than Iu, the total of the currents sourced into the bit lines is negative in all cases.

It should also be noted that the differential compare is a special case of the majority function described above. To detect a match of three bits, two 0 bits are added, and compared to 1, so that they never match. The majority will be detected only if all said three bits match—in all other cases the complemented-bit-line has more than two drivers.

Those knowledgeable in the art will appreciate that sense amplifiers which measure the difference in current, for the three functions described above, are often implemented as voltage sensing sense amplifiers, measuring the voltage build on extrinsic and/or an intrinsic capacitance as a result of the difference in currents. Accordingly, embodiments of the current invention may incorporate direct current sense amplifiers and/or voltage sense amplifiers, which sense current indirectly.

It should be re-emphasized that there may be other applications of the present invention, all based on the principle that several word lines are activated, and the sense amplifier detects on which of ~bit line and ~bit line the current is larger. All those application are encompassed within the framework of the present invention.

Modified Memory Cell: Pocket Implants

Figure 16:
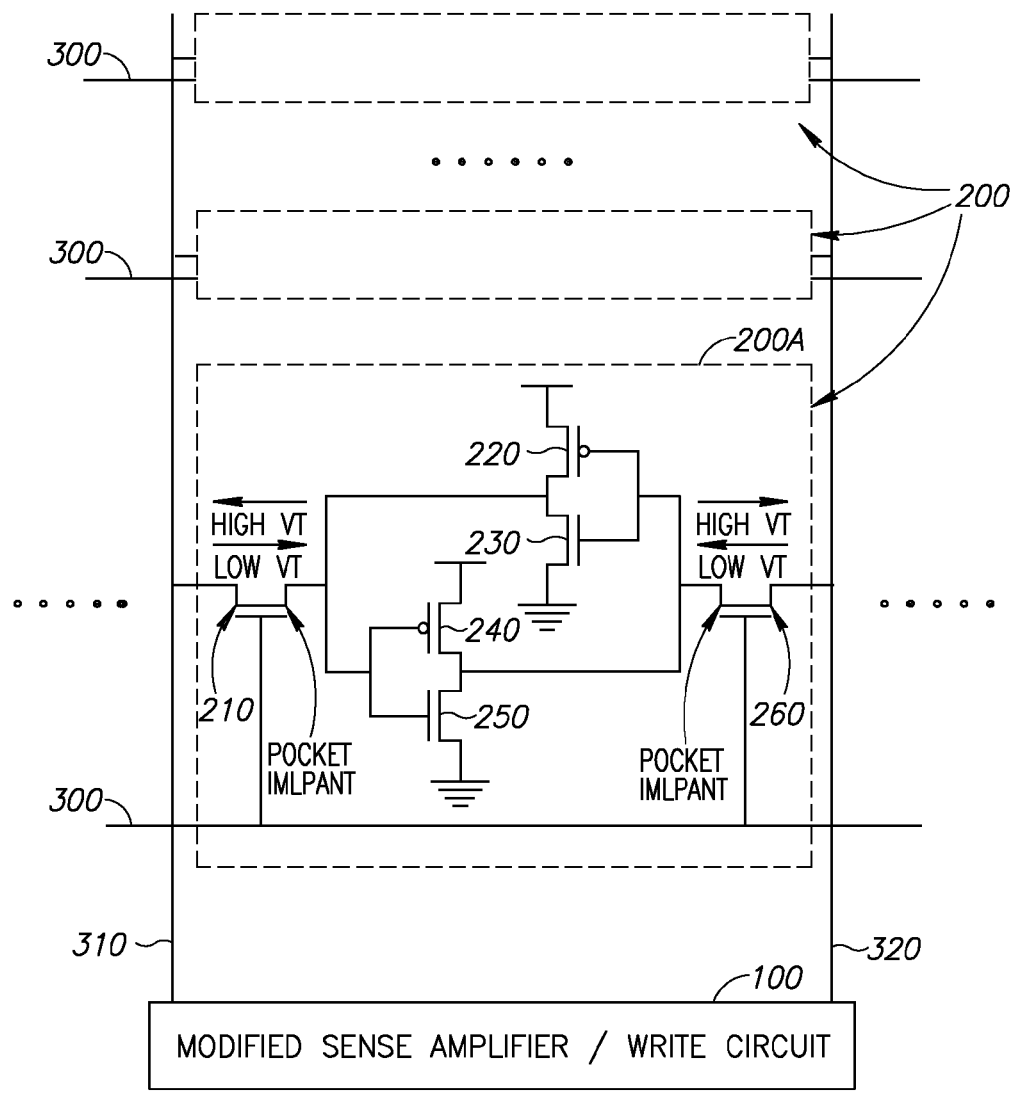
FIG. 16 is a circuit diagram of a preferred embodiment of an SRAM cell with a pocket implant according to the teachings of the present invention.
Figure 17:
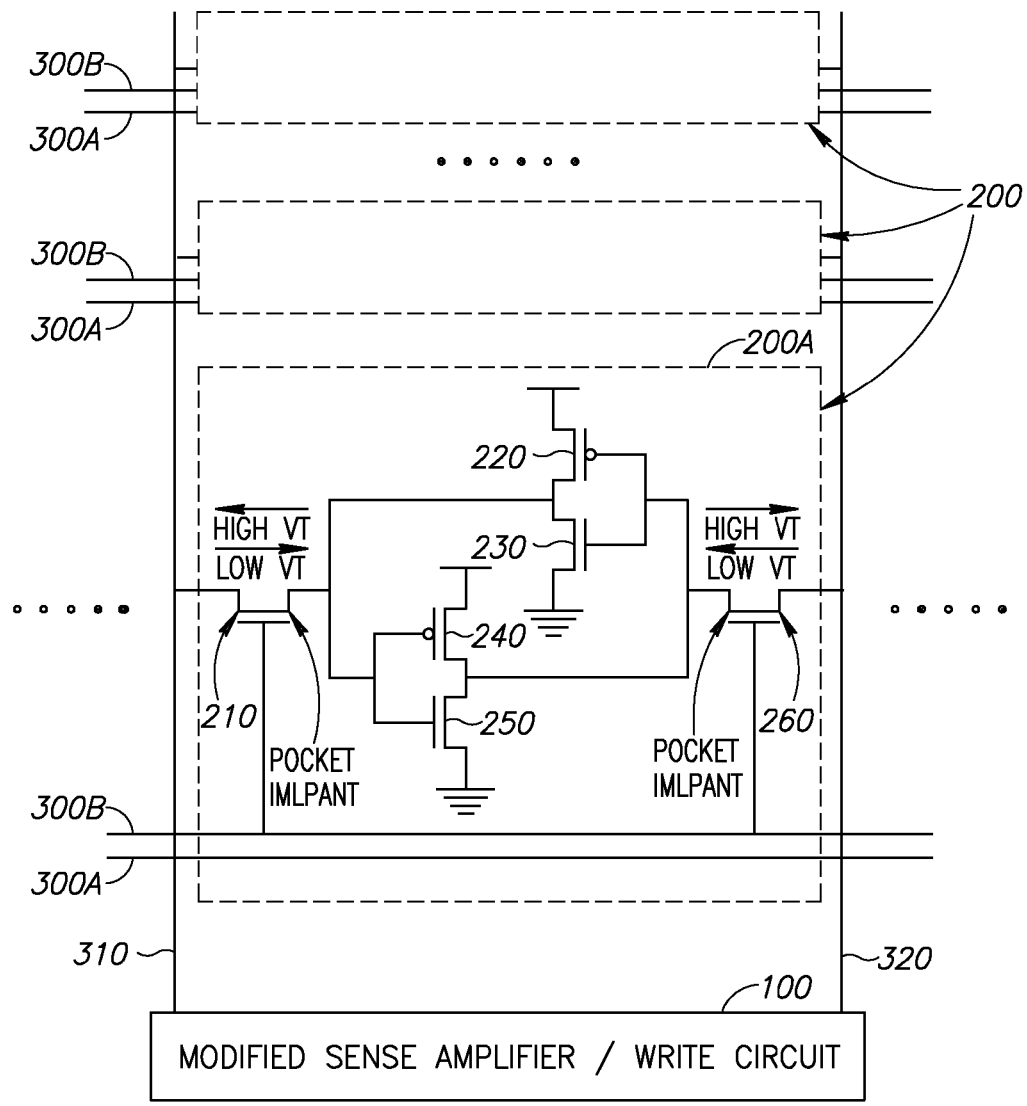
FIG. 17 is a circuit diagram of a preferred embodiment of a modified SRAM cell with a pocket implant according to the teachings of the present invention.

According to further features in some embodiments of the invention, a pocket implant is applied to the memory cells in order to prevent flipping. FIGS. 16 and 17 depict standard and modified SRAM cells, respectively. In both cases, pocket implant is applied, typically with a tilt, to devices 210 and 260, at the source/drain edge which is adjacent to the inverters 220, 230, 240, 250. As known in the industry, this type of doping changes the Vt of the devices as a function of the current direction.

Typically, the threshold for current flow from the bit lines 75 to the inverters will be set to 0.5V, while the threshold for current flow from the inverters to the bit lines will be set to 1.2V. In a Compare operation, the bit lines will be set to a level of typically 1.1V, and for Write operation, the bit lines will be set to a level of typically 1.5V.

The numbers quoted above may vary substantially from process to process, and according to optimization parameters. The numbers are quoted only for the purpose of a clear disclosure. The actual numbers should answer the following constraints:

a. For programming, word-line voltage should be higher than the higher Vt, with a margin calculated to allow Write cycle duration which meets the requirements, and yet the word line voltage should be safely below the breakdown voltage of the transfer devices.
b. For compare, word-line voltage should be higher than the low Vt, with a margin calculated to allow compare cycle period to meet its requirements, yet lower than the high Vt with a margin to assure that no cell with flip in worst-case conditions.

In the foregoing specification, the invention has been described with reference to specific exemplary embodiments thereof. It will, however, be evident that various modifications and changes may be made to the specific exemplary embodiments without departing from the broader spirit and scope of the invention as set forth in the appended claims. Accordingly, the specification and drawings are to be regarded in an illustrative rather than a restrictive sense.

What is claimed is:

1. A circuit to concurrently evaluate sum-of-products functions of a given input vector and a multitude of stored vectors, the circuit comprising:
   a plurality of memory cells interconnected by a plurality of bit lines and
   a sense amplifier connected to said plurality of bit lines to measure a voltage level on said bit lines, wherein each of the stored vectors is stored in said memory cells along one of said bit lines, the input vector is introduced by activating a selected set of word lines of said plurality of memory cells, the sum-of-products being evaluated by said sense amplifier measuring a voltage level on said bit lines; and where the circuit also performs standard memory functions.

2. The circuit of claim 1, wherein said memory cells are standard SRAM cells.

3. The circuit of claim 1, wherein said memory cells are standard DRAM cells.

4. A circuit to concurrently evaluate sum-of-products functions of a given input vector and a multitude of stored vectors, the circuit comprising:
   a plurality of memory cells interconnected by a plurality of bit lines and
   a sense amplifier connected to said plurality of bit lines to measure a voltage level on said bit lines, wherein each of the stored vectors is stored in said memory cells along one of said bit lines, the input vector is introduced by activating a selected set of word lines of said plurality of memory cells, the sum-of-products being evaluated by said sense amplifier measuring a voltage level on said bit lines; and where the circuit also performs standard memory functions,
   wherein said SRAM cells comprise pull-down devices and said sense amplifier comprises voltage limiting sub-circuits which force the voltage on said bit lines to a level not lower than a threshold voltage, which is higher than the threshold voltage of said pull-down devices.

5. A circuit to concurrently evaluate sum-of-products functions of a given input vector and a multitude of stored vectors, the circuit comprising:
   a plurality of memory cells interconnected by a plurality of bit lines and
   a sense amplifier connected to said plurality of bit lines to measure a voltage level on said bit lines, wherein each of the stored vectors is stored in said memory cells along one of said bit lines, the input vector is introduced by activating a selected set of word lines of said plurality of memory cells, the sum-of-products being evaluated by said sense amplifier measuring a voltage level on said bit lines;
   and where the circuit also performs standard memory functions,
   wherein a portion of said bit lines are inverted bit lines, wherein a sum of product operation is executed in parallel for the stored vectors and the inverse of the stored vectors, the sum-of-products operation of an input vector and the stored vectors being performed by said sense amplifier sensing a voltage level on said bit lines, and the sum-of-products operation of an input vector and the inverse of the stored vectors being performed by said sense amplifier measuring a voltage level on said inverted bit lines.

6. A circuit to concurrently evaluate sum-of-products function of a given input vector and a multitude of stored vectors, comprising a standard DRAM array, where stored vectors are stored along bit lines in DRAM cells in said DRAM array, input vectors are introduced by activating selected Read-Write lines of said DRAM array, and sum-of-products are evaluated by sensing the voltage level on said bit lines; and where said DRAM array also retains standard DRAM functionality.

7. The circuit of claim 6, wherein the sum-of-products operation is destructive.

8. The circuit of claim 6, wherein separate products are read sequentially, in parallel for a multitude of stored vectors, and with logic external to said array determining the logic level of a sum of the products.

* * * * *